(12) United States Patent
Miyamoto et al.

(10) Patent No.: US 10,249,715 B2
(45) Date of Patent: Apr. 2, 2019

(54) SEMICONDUCTOR DEVICE AND METHOD OF MANUFACTURING THE SEMICONDUCTOR DEVICE

(71) Applicant: Renesas Electronics Corporation, Tokyo (JP)

(72) Inventors: Hironobu Miyamoto, Ibaraki (JP); Tatsuo Nakayama, Ibaraki (JP); Atsushi Tsuboi, Ibaraki (JP); Yasuhiro Okamoto, Ibaraki (JP); Hiroshi Kawaguchi, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/604,848

(22) Filed: May 25, 2017

(65) Prior Publication Data

US 2018/0026099 A1 Jan. 25, 2018

(30) Foreign Application Priority Data

Jul. 25, 2016 (JP) ................................. 2016-145268

(51) Int. Cl.
*H01L 29/10* (2006.01)
*H01L 23/522* (2006.01)
(Continued)

(52) U.S. Cl.
CPC ...... *H01L 29/1087* (2013.01); *H01L 23/5226* (2013.01); *H01L 23/5286* (2013.01);
(Continued)

(58) Field of Classification Search
CPC .................. H01L 29/1087; H01L 29/7787
See application file for complete search history.

(56) References Cited

U.S. PATENT DOCUMENTS 9,978,642 B2 * 5/2018 Nakayama .............. H01L 29/78
10,014,403 B2 * 7/2018 Nakayama .......... H01L 29/0649
(Continued)

FOREIGN PATENT DOCUMENTS

| EP | 2 884 539 A1 | 6/2015 |
|---|---|---|
| JP | 2013-058791 A | 3/2013 |
| JP | 2015-115582 A | 6/2015 |

OTHER PUBLICATIONS

Machine translation, Kanbayashi, Japanese Pat. Pub. No. JP 2013-058791, translation date: Aug. 15, 2018, Espacenet, all pages.*
(Continued)

*Primary Examiner* — Victoria K Hall
(74) *Attorney, Agent, or Firm* — Sughrue Mion, PLLC

(57) ABSTRACT

Properties of a semiconductor device are improved. A semiconductor device is configured so as to include a voltage clamp layer, a channel underlayer, a channel layer, and a barrier layer, which are formed in order above a substrate, a trench that extends up to the middle of the channel layer while penetrating through the barrier layer, a gate electrode disposed within the trench with a gate insulating film in between, a source electrode and a drain electrode formed above the barrier layer on both sides of the gate electrode, and a fourth electrode electrically coupled to the voltage clamp layer. The fourth electrode is electrically isolated from the source electrode, and a voltage applied to the fourth electrode is different from a voltage applied to the source electrode. Consequently, threshold control can be performed. For example, a threshold of a MISFET can be increased.

20 Claims, 35 Drawing Sheets

(51) Int. Cl.
*H01L 23/528* (2006.01)
*H01L 29/20* (2006.01)
*H01L 29/205* (2006.01)
*H01L 29/423* (2006.01)
*H01L 29/66* (2006.01)
*H01L 29/778* (2006.01)
*H01L 29/417* (2006.01)
*H01L 29/45* (2006.01)

(52) U.S. Cl.
CPC ........ *H01L 29/2003* (2013.01); *H01L 29/205* (2013.01); *H01L 29/42364* (2013.01); *H01L 29/66462* (2013.01); *H01L 29/7783* (2013.01); *H01L 29/7787* (2013.01); *H01L 29/1066* (2013.01); *H01L 29/41758* (2013.01); *H01L 29/4236* (2013.01); *H01L 29/452* (2013.01)

(56) References Cited

U.S. PATENT DOCUMENTS

| | | | |
|---|---|---|---|
| 10,050,142 B2* | 8/2018 | Nakayama | H01L 29/7783 |
| 10,109,730 B2* | 10/2018 | Nakayama | H01L 21/02694 |
| 2007/0278521 A1 | 12/2007 | Ishida et al. | |
| 2015/0171204 A1* | 6/2015 | Nakayama | H01L 29/0649 257/20 |
| 2016/0064538 A1* | 3/2016 | Nakayama | H01L 29/7783 257/20 |
| 2017/0250274 A1* | 8/2017 | Nakayama | H01L 21/02694 |

OTHER PUBLICATIONS

Communication dated Dec. 14, 2017 from the European Patent Office in counterpart application No. 17180221.8.

* cited by examiner

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2016-145268 filed on Jul. 25, 2016 including the specification, drawings and abstract is incorporated herein by reference in its entirety.

BACKGROUND

The present invention relates to a semiconductor device and a method of manufacturing the semiconductor device. Specifically, the invention can be preferably applied to a semiconductor device including a nitride semiconductor.

A field effect transistor including a nitride semiconductor can perform high frequency operation and has properties of high withstand voltage and low on-resistance. The field effect transistor including the nitride semiconductor is therefore used in a switching power supply or an inverter of a power electronics system, and contributes to reductions in size and weight of a peripheral passive element due to high frequency operation and a reduction in loss due to low on-resistance.

For example, Japanese Unexamined Patent Application Publication No. 2015-115582 (JP-A-2015-115582) discloses a technology on a normally-off field effect transistor having a voltage clamp layer, in which the voltage clamp layer is electrically coupled to a source electrode by a coupling part extending up to the voltage clamp layer.

Japanese Unexamined Patent Application Publication No. 2013-58791 (JP-A-2013-58791) discloses a MOSFET including a buffer layer on a substrate and a lower semiconductor layer made of p-GaN on the buffer layer. The MOSFET includes a carrier transit layer on the lower semiconductor layer, carrier supply layers formed on the carrier transit layer and separated by a recess portion, a gate insulating film formed so as to cover the surface of the carrier transit layer in the recess portion, and a gate electrode formed on the gate insulating film.

SUMMARY

A field effect transistor including a nitride semiconductor uses a two-dimensional electron gas generated by positive polarization charge peculiar to nitride semiconductor at a heterointerface between a channel layer (for example, GaN) and a barrier layer (for example, AlGaN). Access resistance between a source and a gate or between a gate and the drain can be reduced by the two-dimensional electron gas. In addition, a recess is formed by removing part of the barrier layer (for example, AlGaN), and a MOS gate structure is formed in the recess, thereby normally-off operation can be achieved.

A threshold of such a recess-gate-type field effect transistor including a nitride semiconductor is around 0 V while varying depending on a MOS interface. Investigations have been made to allow the threshold to be close to, for example, 2 to 3 V that is the threshold of a Si device.

For example, the MOSFET of JP-A-2013-58791 has the lower semiconductor layer made of p-GaN as an underlayer of the channel of the MOSFET to increase the threshold. In JP-A-2015-115582, the voltage clamp layer and the source electrode are electrically coupled to each other to have the same voltage, which suppresses a decrease in the threshold due to a drain voltage and variations in properties.

Through investigations, however, the inventors have found that each of the techniques described in such documents does not provide a sufficient range of threshold adjustment as described later, and there is room for further improvement in a configuration of the semiconductor device in order to adjust the threshold to 2 to 3 V which is the threshold of the Si device.

Other objects and novel features will be clarified from the description of this specification and the accompanying drawings.

A typical one of embodiments disclosed in this application is briefly summarized as follows.

In the semiconductor device of one embodiment disclosed in this application, a voltage clamp layer is provided below a gate electrode of a field effect transistor including a nitride semiconductor, and a voltage different from a voltage applied to a source electrode is applied to the voltage clamp layer.

A method of manufacturing a semiconductor device according to one embodiment disclosed in this application includes a step of providing a through hole that extends up to a voltage clamp layer below a gate electrode of a field effect transistor including a nitride semiconductor, and forming a coupling electrode including a conductive film in the through hole. The coupling electrode is electrically coupled to a voltage different from a voltage applied to a source electrode.

According to the semiconductor device described in each of the following typical embodiments disclosed herein, properties of the semiconductor device can be improved.

According to the method of manufacturing the semiconductor device described in each of the following typical embodiments disclosed herein, a semiconductor device having good properties can be manufactured.

DETAILED DESCRIPTION

Although each of the following embodiments may be dividedly described in a plurality of sections or embodiments for convenience as necessary, they are not unrelated to one another except for the particularly defined case, and are in a relationship where one is a modification, an application, detailed explanation, supplementary explanation, or the like of part or all of another one. In each of the following embodiments, when the number of elements and the like (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, a constitutional element (including an element step etc.) of the embodiment is not necessarily indispensable except for the particularly defined case and for the case where the constitutional element is considered to be indispensable in principle. Similarly, in the following embodiment, when a shape of a constitutional element, a positional relationship, and the like are described, any configuration substantially closely related to or similar to such a shape or the like should be included except for the particularly defined case and for the case where such a configuration is considered to be not included in principle. The same holds true in each of the number of elements and the like (including the number, a numerical value, amount, and a range).

Hereinafter, some embodiments will be described in detail with reference to the accompanying drawings. In all drawings for explaining the embodiments, components having the same function are designated by the same or relevant numeral, and duplicated description is omitted. If a plurality of similar components (sites) exist, the numeral for a general term may be further marked with a sign to indicate an individual or a particular site. In the following embodiments, the same or similar portion is not repeatedly described in principle except for a particularly required case.

Furthermore, a sectional view for explaining each embodiment may not be hatched for better viewability. A plan view may be hatched for better viewability.

In the sectional views and the plan views, size of each site does not correspond to size of an actual device, and a particular site may be illustrated to be relatively large for better viewability. Even if a section view corresponds to a plan view, a particular site may be illustrated to be relatively large for better viewability.

First Embodiment

A semiconductor device of a first embodiment is now described in detail with reference to the accompanying drawings.

Description of Structure

Figure 1:
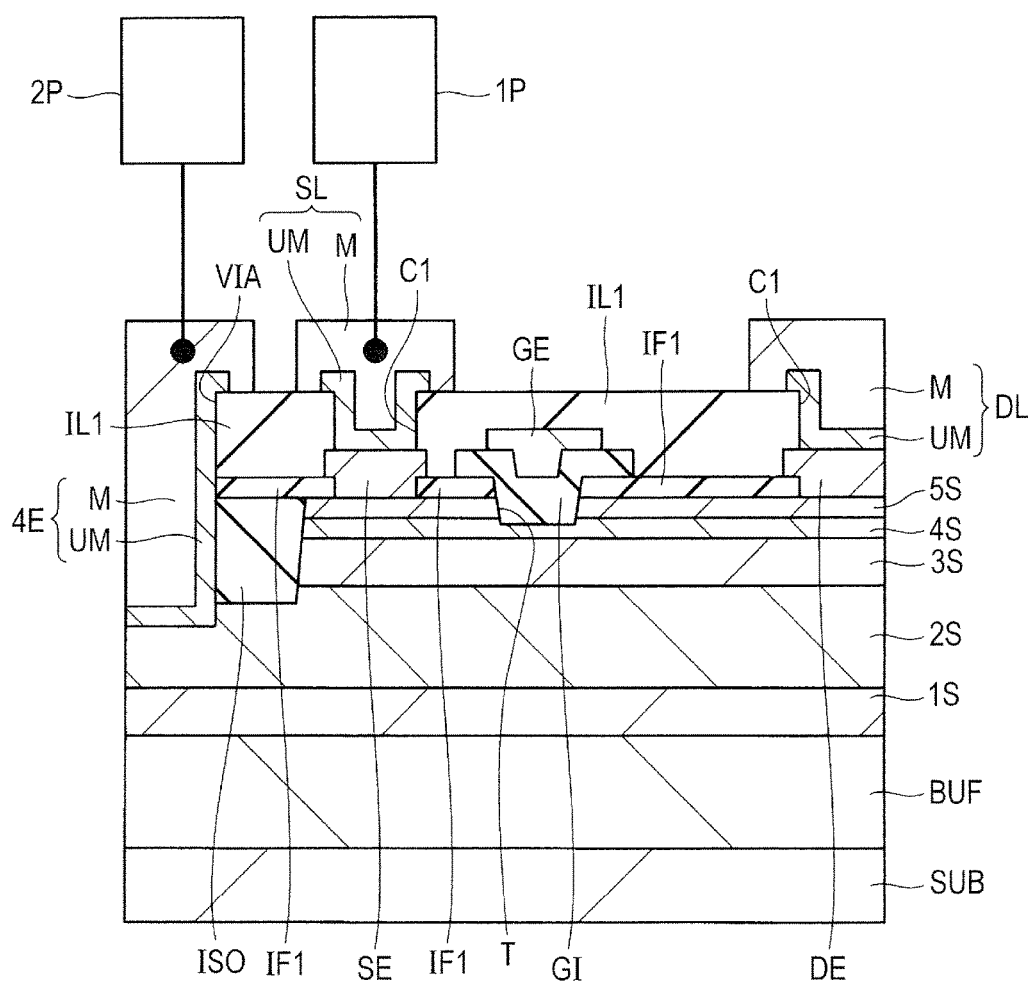
FIG. 1 is a sectional view illustrating a configuration of a semiconductor device of a first embodiment.

FIG. 1 is a sectional view illustrating a configuration of the semiconductor device of the first embodiment. The semiconductor device (semiconductor element) of the first embodiment illustrated in FIG. 1 or others is a field effect transistor (FET) of a metal insulator semiconductor (MIS) type including a nitride semiconductor. The semiconductor device can be used as a power transistor of a high electron mobility transistor (HEMT) type. The semiconductor device of the first embodiment is what is called a recess-gate-type semiconductor device.

The semiconductor device of the first embodiment has a high-resistance buffer layer BUF on a substrate SUB. A nucleation layer may be formed on the substrate SUB before forming the high-resistance buffer layer BUF thereon.

For, example, a semiconductor substrate made of silicon (Si) exposing a (111) plane may be used as the substrate SUB. Not only silicon but also SiC or sapphire may be used for the substrate SUB. A substrate made of GaN may also be used. In such a case, the nucleation layer may be omitted.

The nucleation layer includes a nitride semiconductor layer. For example, an aluminum nitride (AlN) layer can be used as the nucleation layer. The high-resistance buffer layer BUF includes one or more nitride semiconductor layers each including a nitride semiconductor doped with an impurity forming a deep level. For example, a superlattice structure including a plurality of nitride semiconductor layers, which may be referred to as superlattice layer, is formed by repeatedly forming a film stack (AlN/GaN film) of a gallium nitride (GaN) layer and an aluminum nitride (AlN) layer, and can be used as the high-resistance buffer layer BUF.

Any of the nitride semiconductor layers (III-V compound semiconductor layers) on the substrate SUB is typically formed by group III face growth.

First to fifth nitride semiconductor layers 1S to 5S are provided in order on the high-resistance buffer layer BUF.

The first nitride semiconductor layer (buffer layer) 1S may be referred to as buffer layer. The buffer layer includes, for example, an undoped AlGaN layer (i-AlGaN layer).

The second nitride semiconductor layer (voltage clamp layer) 2S may be referred to as voltage clamp layer. The second nitride semiconductor layer 2S contains a p-type impurity (for example, Mg). In other words, the second nitride semiconductor layer 2S is doped with the p-type impurity (for example, Mg). The voltage clamp layer includes, for example, a p-AlGaN layer.

The third nitride semiconductor layer (channel underlayer) 3S may be referred to as channel underlayer. The third nitride semiconductor layer 3S has an electron affinity substantially equal to that of the second nitride semiconductor layer 2S (3S≈2S). However, the third nitride semiconductor layer 3S may have an electron affinity larger than that of the second nitride semiconductor layer 2S (3S>2S). The channel underlayer includes, for example, an undoped AlGaN layer (i-AlGaN layer).

The fourth nitride semiconductor layer (channel layer) 4S may be referred to as channel layer or electron transit layer. The fourth nitride semiconductor layer 4S has an electron affinity substantially equal to or larger than that of the second nitride semiconductor layer 2S (4S≥2S). The channel layer includes, for example, an InGaN layer.

The fifth nitride semiconductor layer (barrier layer) 5S may be referred to as barrier layer. The fifth nitride semiconductor layer 5S has an electron affinity smaller than that of the second nitride semiconductor layer 2S (5S<2S). The barrier layer includes, for example, an AlGaN layer.

An insulating film IF1 is provided on the fifth nitride semiconductor layer (barrier layer) 5S. Another nitride semiconductor layer (cap layer) may be provided between the insulating film IF1 and the fifth nitride semiconductor layer 5S. The cap layer has an electron affinity larger than that of the fifth nitride semiconductor layer (barrier layer) 5S.

The MISFET of the first embodiment includes a gate electrode GE above the fourth nitride semiconductor layer (channel layer) 4S with a gate insulating film GI in between, and a source electrode SE and a drain electrode DE on the fifth nitride semiconductor layer (barrier layer) 5S on the both sides of the gate electrode GE. A source line SL and a drain line DL coupled to the source electrode SE and the drain electrode DE are disposed on the source electrode SE and the drain electrode DE, respectively. The source line SL and the drain line DL are each formed of a film stack of an underlying metal film UM and a metal film M. This MISFET is provided in an active region partitioned by the element isolation region ISO. The gate electrode GE is provided on the gate insulating film GI in a trench (recess) T that extends up to the middle of the fourth nitride semiconductor layer (channel layer) 4S while penetrating through the fifth nitride semiconductor layer (barrier layer) 5S.

A two-dimensional electron gas (2DEG) is generated on a side close to the fourth nitride semiconductor layer (channel layer) 4S in the vicinity of an interface between the fourth nitride semiconductor layer (channel layer) 4S and the fifth nitride semiconductor layer (barrier layer) 5S. When a positive voltage (threshold voltage) is applied to the gate electrode GE, a channel is formed in the vicinity of an interface between the gate insulating film GI and the fourth nitride semiconductor layer (channel layer) 4S.

The two-dimensional electron gas (2DEG) is formed by the following mechanism. The nitride semiconductor layers, each of which is a gallium nitride-based semiconductor layer herein, corresponding to the fourth nitride semiconductor layer (channel layer) 4S and the fifth nitride semiconductor layer (barrier layer) 5S have different electron affinities (bandgaps) from each other. Hence, the fifth nitride semiconductor layer (barrier layer) 5S is made of a nitride semiconductor having an electron affinity smaller than that of the fourth nitride semiconductor layer (channel layer) 4S. A well-type potential is therefore formed at a junction plane of such semiconductor layers (see FIG. 18B). Electrons are accumulated within the well-type potential, thereby the two-dimensional electron gas (2DEG) is generated in the vicinity of the interface between the fourth nitride semiconductor layer (channel layer) 4S and the fifth nitride semiconductor layer (barrier layer) 5S.

The two-dimensional electron gas (2DEG), which is generated in the vicinity of the interface between the fourth nitride semiconductor layer (channel layer) 4S and the fifth nitride semiconductor layer (barrier layer) 5S, is separated by the trench T having the gate electrode GE therein. Hence, the semiconductor device of the first embodiment can maintain an off state while a positive voltage (threshold voltage) is not applied to the gate electrode GE, and can maintain an on state while the positive voltage (threshold voltage) is applied to the gate electrode GE. In this way, the semiconductor device can perform normally-off operation.

In the first embodiment, a via hole VIA, which extends up to the second nitride semiconductor layer (voltage clamp layer) 2S below the element isolation region ISO while penetrating through the element isolation region ISO, is provided, and a fourth electrode (coupling electrode, coupling part) 4E is provided in the via hole VIA. Specifically, the MISFET is a device having three terminals (gate, source, drain), and that electrode is referred to as "fourth electrode 4E" because it is an electrode other than the three electrodes of the gate electrode GE, the source electrode SE, and the drain electrode DE. The fourth electrode 4E is electrically isolated from other electrodes (the source electrode SE and the drain electrode DE) by the element isolation region. The fourth electrode 4E is electrically coupled to the second nitride semiconductor layer (voltage clamp layer) 2S. The fourth electrode 4E is also formed of a film stack of the underlying metal film UM and the metal film M as with the source line SL or the drain line DL.

A second voltage is applied to the fourth electrode 4E from a voltage (potential) application unit 2P, and a first voltage is applied to the source electrode SE from a voltage application unit 1P. The second voltage applied to the fourth electrode 4E is different from, or lower than, the first voltage (source voltage).

Specifically, the source electrode SE is coupled to the ground voltage. Hence, the voltage application unit 1P is a ground voltage application unit (ground), and the first voltage is the ground voltage (0 V). The fourth electrode 4E is coupled to an external power supply (for example, an external DC power supply) as the voltage application unit 2P, and the second voltage is a negative voltage.

In this way, the first embodiment provides a recess-gate-type MISFET including a nitride semiconductor, in which the second nitride semiconductor layer (voltage clamp layer) 2S and the fourth electrode 4E, which are electrically coupled to each other, are provided, and a voltage lower than the voltage (source voltage) applied to the source electrode SE is applied to the second nitride semiconductor layer (voltage clamp layer) 2S via the fourth electrode 4E, thereby threshold control can be performed. For example, the threshold of the MISFET can be increased. For example, the threshold can be adjusted to be close to 2 to 3 V, which is the threshold of a device including Si. These are described in detail later.

Description of Manufacturing Method

A method of manufacturing the semiconductor device of the first embodiment is now described with reference to FIGS. 2 to 15 while the configuration of the semiconductor device is further clarified. FIGS. 2 to 15 include sectional views and plan views illustrating a manufacturing process of the semiconductor device of the first embodiment.

Figure 2:
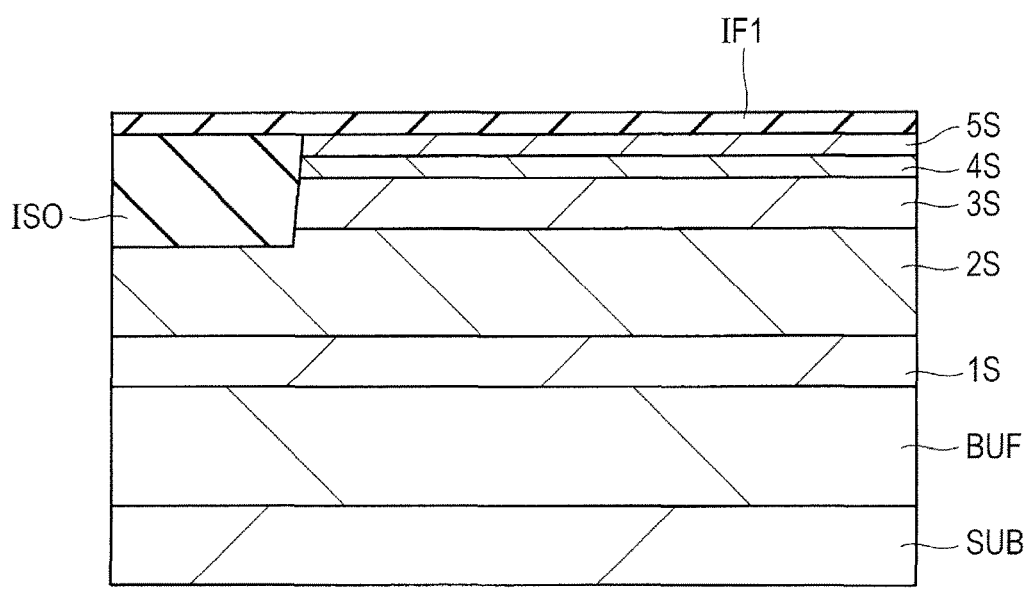
FIG. 2 is a sectional view illustrating a manufacturing process of the semiconductor device of the first embodiment.

As illustrated in FIG. 2, the undepicted nucleation layer, the high-resistance buffer layer BUF, the first nitride semiconductor layer (buffer layer) 1S, the second nitride semiconductor layer (voltage clamp Layer) 2S, the third nitride semiconductor layer (channel underlayer) 3S, the fourth nitride semiconductor layer (channel layer) 4S, and the fifth nitride semiconductor layer (barrier layer) 5S are formed in order on the substrate SUB.

For example, a semiconductor substrate made of p-silicon (Si) exposing a (111) plane is used as the substrate SUB, and, for example, an aluminum nitride (AlN) layer is heteroepitaxially grown as the nucleation layer on the substrate SUB in a thickness of about 200 nm by a metal organic chemical vapor deposition (MOCVD) process or the like.

Not only silicon but also SiC or sapphire may be used for the substrate SUB. A substrate made of GaN may be used. In such a case, the nucleation layer may be omitted. Any of the nucleation layer and the nitride semiconductor layers (III-V compound semiconductor layers) subsequent to the nucleation layer is typically formed by group III face growth (gallium face growth or aluminum face growth herein).

Subsequently, a superlattice structure is formed as the high-resistance buffer layer BUF on the nucleation layer by repeatedly forming a film stack (AlN/GaN film) of a gallium nitride (GaN) layer and an aluminum nitride (AlN) layer. For example, the gallium nitride (GaN) layer about 20 nm thick and the aluminum nitride (AlN) layer about 5 nm thick are heteroepitaxially grown by turns using a metal organic chemical vapor deposition process or the like. For example, 40 layers of the film stack are formed.

Subsequently, for example, an AlGaN layer is heteroepitaxially grown as the first nitride semiconductor layer (buffer layer) 1S on the high-resistance buffer layer BUF by a metal organic chemical vapor deposition process or the like. The AlGaN layer is grown while being not intentionally doped with an impurity. The first nitride semiconductor layer (buffer layer) 1S has a thickness of about 200 nm, for example. Al composition, for example, x expressed as $Al_xGa_{1-x}N$, is 0 to 0.1.

Subsequently, for example, an AlGaN layer (p-AlGaN layer) containing a p-type impurity is epitaxially grown as the second nitride semiconductor layer (voltage clamp layer) 2S on the first nitride semiconductor layer (buffer layer) 1S by a metal organic chemical vapor deposition process or the like. For example, magnesium (Mg) is used as the p-type impurity. For example, an AlGaN layer is deposited about 600 nm while being doped with magnesium (Mg). The Mg concentration in the deposited film is about $5\times10^{18}$ (5E18) $cm^3$, for example. Al composition, for example, x expressed as $Al_xGa_{1-x}N$, is 0 to 0.1.

Subsequently, the third nitride semiconductor layer (channel underlayer) 3S is formed on the second nitride semiconductor layer (voltage clamp layer) 2S. For example, an AlGaN layer is heteroepitaxially grown as the third nitride semiconductor layer (channel underlayer) 3S on the second nitride semiconductor layer (voltage clamp layer) 2S by a metal organic chemical vapor deposition process or the like. The AlGaN layer is grown while being not intentionally doped with an impurity. Thickness of the AlGaN layer is about 200 nm, for example. Al composition, for example, x expressed as $Al_xGa_{1-x}N$, is 0 to 0.1.

Subsequently, the fourth nitride semiconductor layer (channel layer) 4S is formed on the third nitride semiconductor layer (channel underlayer) 3S. For example, an InGaN layer is heteroepitaxially grown on the third nitride semiconductor layer (channel underlayer) 3S by a metal organic chemical vapor deposition process or the like. The InGaN layer is grown while being not intentionally doped with an impurity. The fourth nitride semiconductor layer (channel layer) 4S has a thickness of about 50 nm, for example. In composition, for example, y expressed as $In_yGa_{1-y}N$, is 0 to 0.15.

Subsequently, for example, an AlGaN layer is heteroepitaxially grown as the fifth nitride semiconductor layer (barrier layer) 5S on the fourth nitride semiconductor layer (channel layer) 4S by a metal organic chemical vapor deposition process or the like. The AlGaN layer is grown while being not intentionally doped with an impurity. Thickness of the fifth nitride semiconductor layer 5S is about 20 nm, for example. Al composition, for example, z expressed as $Al_zGa_{1-z}N$, is larger than x and smaller than 0.4 ($x<z<0.4$). The fifth nitride semiconductor layer (barrier layer) 5S may be doped with an n-type impurity (for example, Si).

In this way, there is formed a stack including the third nitride semiconductor layer (channel underlayer) 3S, the fourth nitride semiconductor layer (channel layer) 4S, and the fifth nitride semiconductor layer (barrier layer) 5S. In the stack, the two-dimensional electron gas (2DEG) is generated in the vicinity of the interface between the fourth nitride semiconductor layer (channel layer) 4S and the fifth nitride semiconductor layer (barrier layer) 5S.

Subsequently, another nitride semiconductor layer (cap layer) may be formed on the fifth nitride semiconductor layer (barrier layer) 5S. For example, a gallium nitride layer (GaN layer) is heteroepitaxially grown on the fifth nitride semiconductor layer (barrier layer) 5S by a metal organic chemical vapor deposition process or the like. The GaN layer is grown while being not intentionally doped with an impurity. The cap layer has a thickness of about 2 nm, for example. The cap layer may be doped with an n-type impurity (for example, Si).

Subsequently, a silicon nitride film is deposited, for example, about 100 nm as the insulating film IF1 on the fifth nitride semiconductor layer (barrier layer) 5S by a plasma-enhanced chemical vapor deposition (PECVD) process or the like.

Subsequently, an undepicted photoresist film is formed on the insulating film IF1 to open the element isolation region by a photolithography process. Subsequently, boron ions are implanted with the photoresist film as a mask to form the element isolation region ISO. Ion species such as boron (B) or nitrogen (N) is thus implanted, thereby a crystal state is changed, leading to higher resistance.

Figure 3:
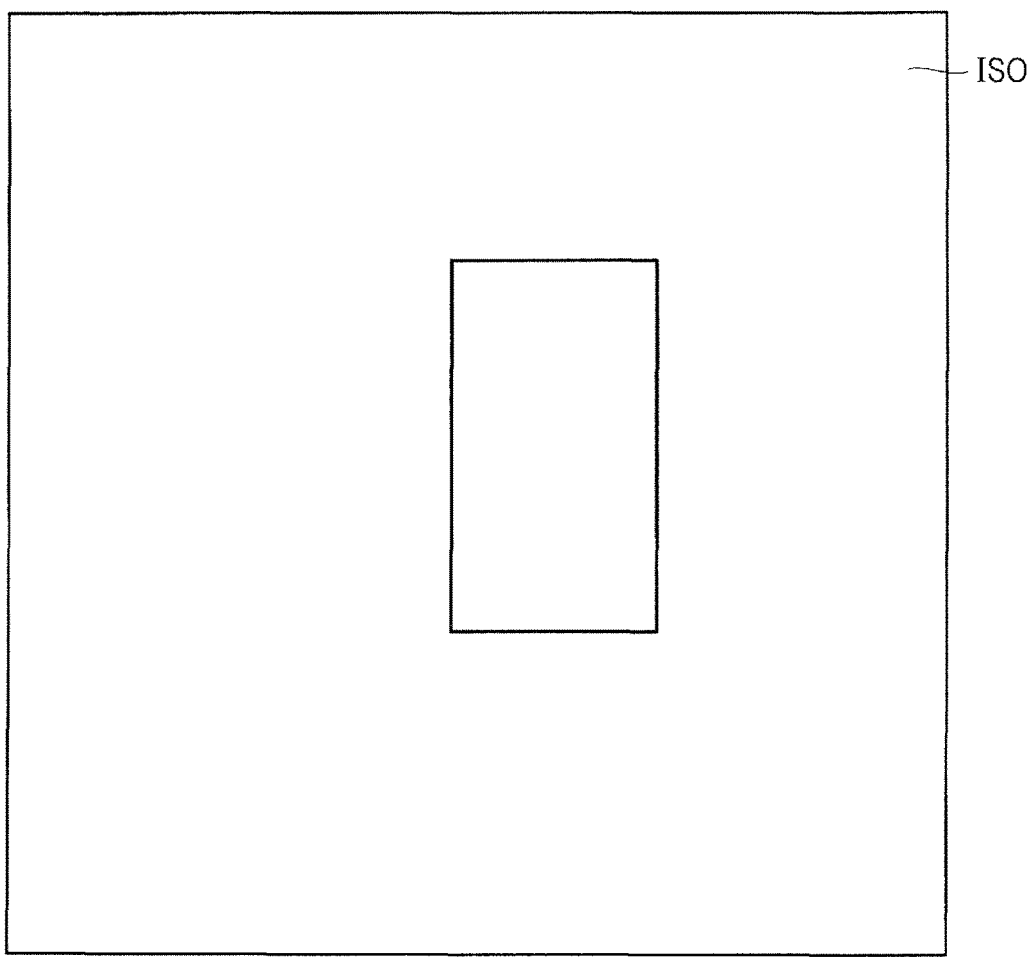
FIG. 3 is a plan view illustrating the manufacturing process of the semiconductor device of the first embodiment.

For example, boron ions are implanted at a density of about $5 \times 10^{14}$ (5E14) $cm^{-2}$ into the stack of the third nitride semiconductor layer (channel underlayer) 3S, the fourth nitride semiconductor layer (channel layer) 4S, and the fifth nitride semiconductor layer (barrier layer) 5S through the insulating film IF1. The implantation energy is about 120 keV, for example. The implantation condition of the boron ions is adjusted such that implantation depth, i.e., the bottom of the element isolation region ISO is located below the bottom of the third nitride semiconductor layer (channel underlayer) 3S and above the bottom of the second nitride semiconductor layer (voltage clamp layer) 2S. The bottom of the element isolation region ISO is located above the bottom of a via hole (VIA) described later. In this way, the element isolation region ISO is formed. A region surrounded by the element isolation region ISO acts as an active region. As shown in FIG. 3, the active region surrounded by the element isolation region ISO has a roughly rectangular shape, for example. Subsequently, the photoresist film is removed by a plasma stripping process or the like.

Figure 4:
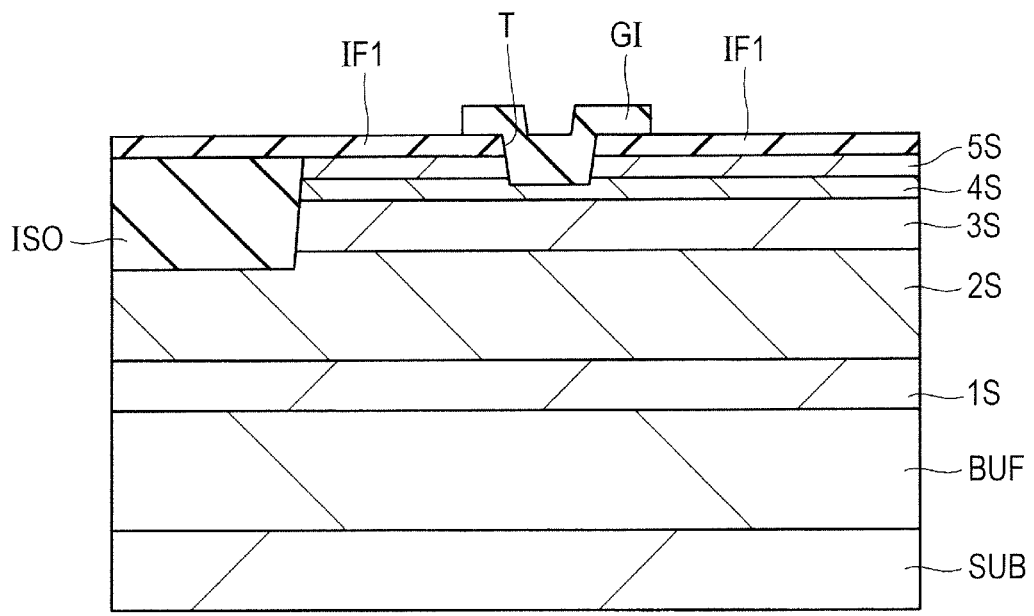
FIG. 4 is a sectional view illustrating the manufacturing process of the semiconductor device of the first embodiment.

Subsequently, as shown in FIG. 4, a trench T is formed, and a gate insulating film GI is formed thereon. First, the insulating film IF1 is patterned using a photolithography technique and an etching technique. For example, an undepicted photoresist film having an opening in the formation region of the trench T is formed on the insulating film IF1. Subsequently, the insulating film IF1 is etched with the undepicted photoresist film as a mask. When the silicon nitride film is used as the insulating film IF1, dry etching is performed using a fluorine-based gas such as $SF_6$, for example. Subsequently, the undepicted photoresist film is removed by a plasma stripping process or the like.

Subsequently, the fifth nitride semiconductor layer (barrier layer) 5S and the fourth nitride semiconductor layer (channel layer) 4S are dry-etched with the insulating film IF1 as a mask to form the trench T that extends up to the middle of the fourth nitride semiconductor layer (channel layer) 4S while penetrating through the fifth nitride semiconductor layer (barrier layer) 5S. For example, a chlorine-based gas such as $BCl_3$ is used as the etching gas. Subsequently, the surface of the trench T is subjected to acid treatment (for example, hydrochloric acid treatment).

Subsequently, an aluminum oxide film is deposited as the gate insulating film GI on the insulating film IF1 including within the trench T in a thickness of about 100 nm by an atomic layer deposition (ALD) process or the like. Subsequently, an undepicted photoresist film is formed in a gate electrode formation region by a photolithography technique, and the aluminum oxide film is etched with the undepicted photoresist film as a mask to form the gate insulating film GI. For example, dry etching is performed using a chlorine-based gas such as $BCl_2$.

Figure 5:
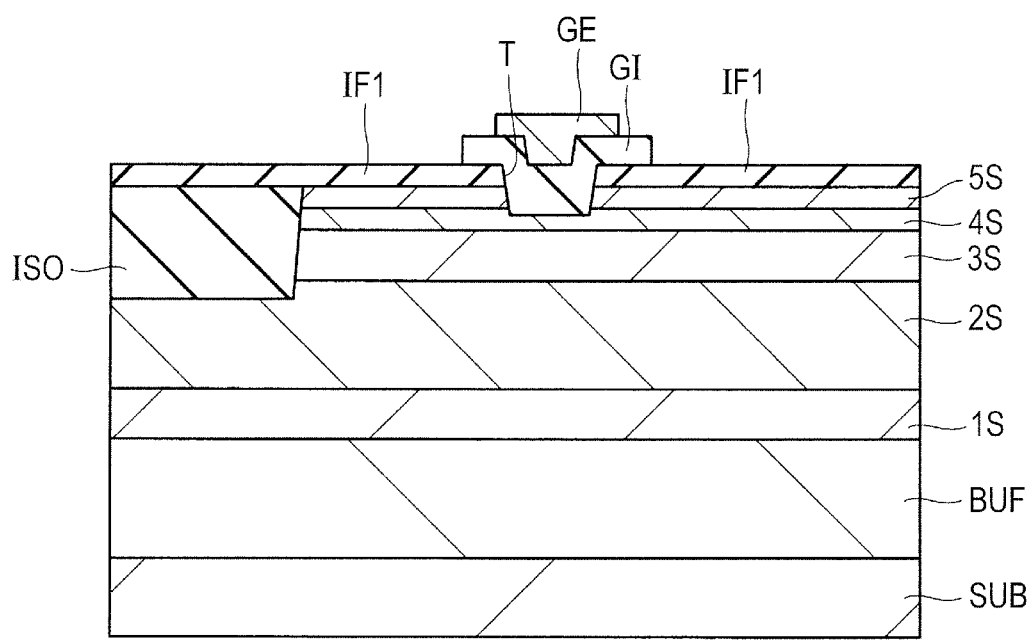
FIG. 5 is a sectional view illustrating the manufacturing process of the semiconductor device of the first embodiment.
Figure 6:
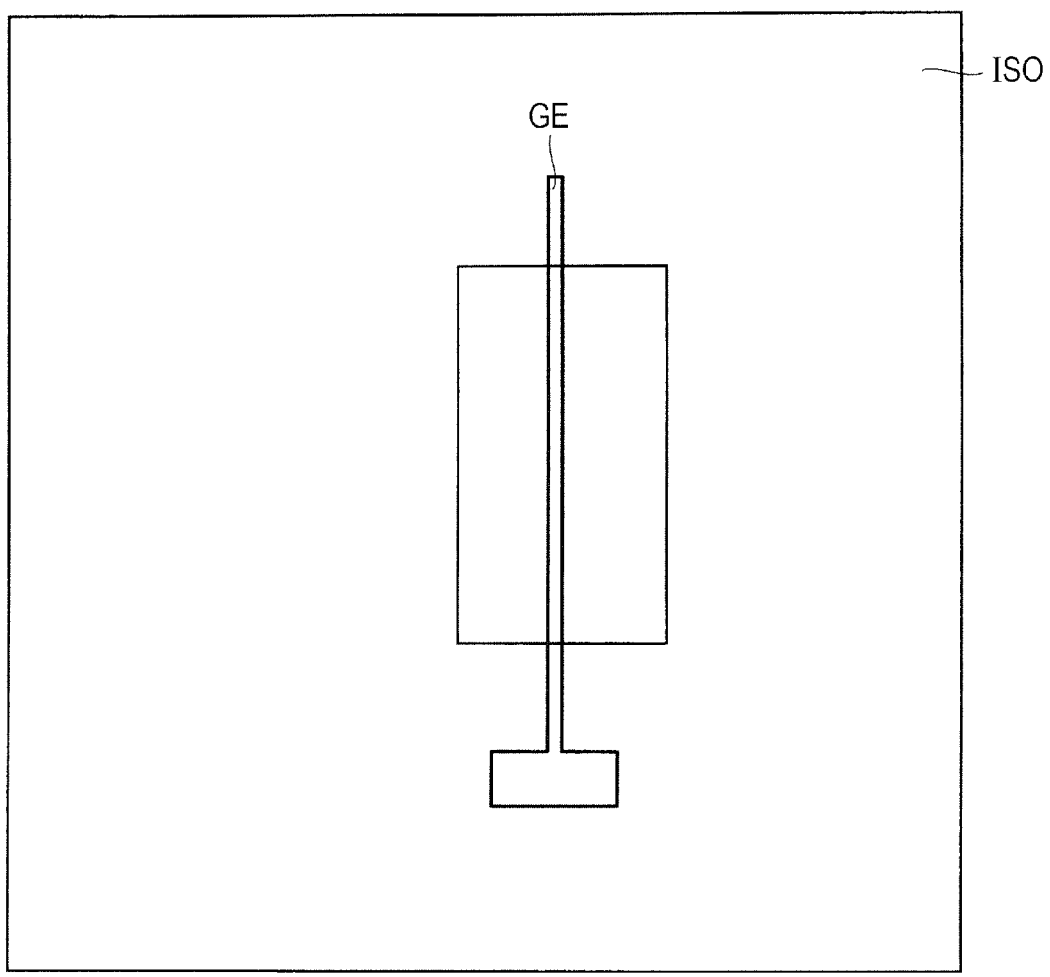
FIG. 6 is a plan view illustrating the manufacturing process of the semiconductor device of the first embodiment.

Subsequently, as shown in FIGS. 5 and 6, the gate electrode GE is formed on the gate insulating film GI. For example, a titanium nitride (TiN) film is deposited as a conductive film on the gate insulating film GI in a thickness of about 100 nm by a sputtering process or the like. Subsequently, an undepicted photoresist film is formed in the gate electrode formation region by a photolithography technique, and the TiN film is etched using the undepicted photoresist film as a mask to form the gate electrode GE. For example, dry etching is performed using a chlorine-based gas. Subsequently, the photoresist film is removed by a plasma stripping process or the like.

Figure 7:
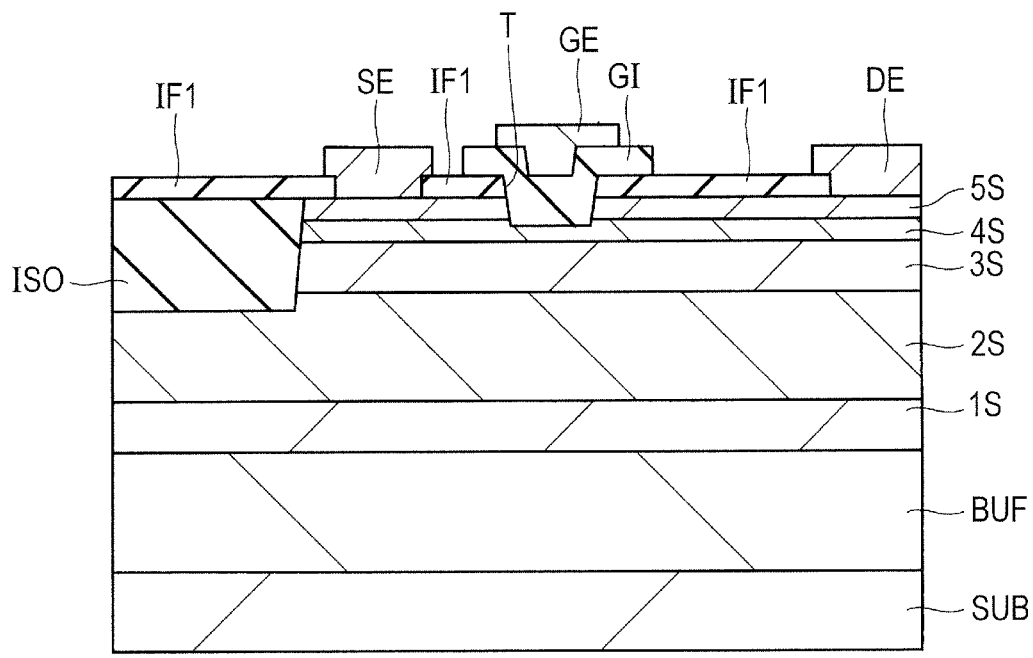
FIG. 7 is a sectional view illustrating the manufacturing process of the semiconductor device of the first embodiment.

Subsequently, as shown in FIG. 7, the source electrode SE and the drain electrode DE are formed on the fifth nitride semiconductor layer (barrier layer) 5S on both sides of the gate electrode GE. For example, part of the insulating film IF1 located on either side of the gate electrode GE is removed using a photolithography technique and an etching technique. For example, dry etching is performed using a fluorine-based gas. Consequently, part of the fifth nitride semiconductor layer (barrier layer) 5S is exposed.

Subsequently, a film stack (Al/Ti) including a titanium (Ti) film and an aluminum (Al) film thereon is formed as a conductive film (ohmic electrode material) on the insulating film IF1 by a sputtering process or the like. The titanium nitride film has a thickness of, for example, about 20 nm, and the aluminum film has a thickness of, for example, about 500 nm. Subsequently, the film stack (Al/Ti) is left on either side of the gate electrode GE by, for example, a photolithography technique and an etching technique to form the source electrode SE and the drain electrode DE. Subsequently, heat treatment is performed at 550° C. for about 30 min, for example. Through the heat treatment, the source electrode SE and the drain electrode DE are allowed to be in ohmic contact with the fifth nitride semiconductor layer (barrier layer) 5S under the respective electrodes.

Figure 8:
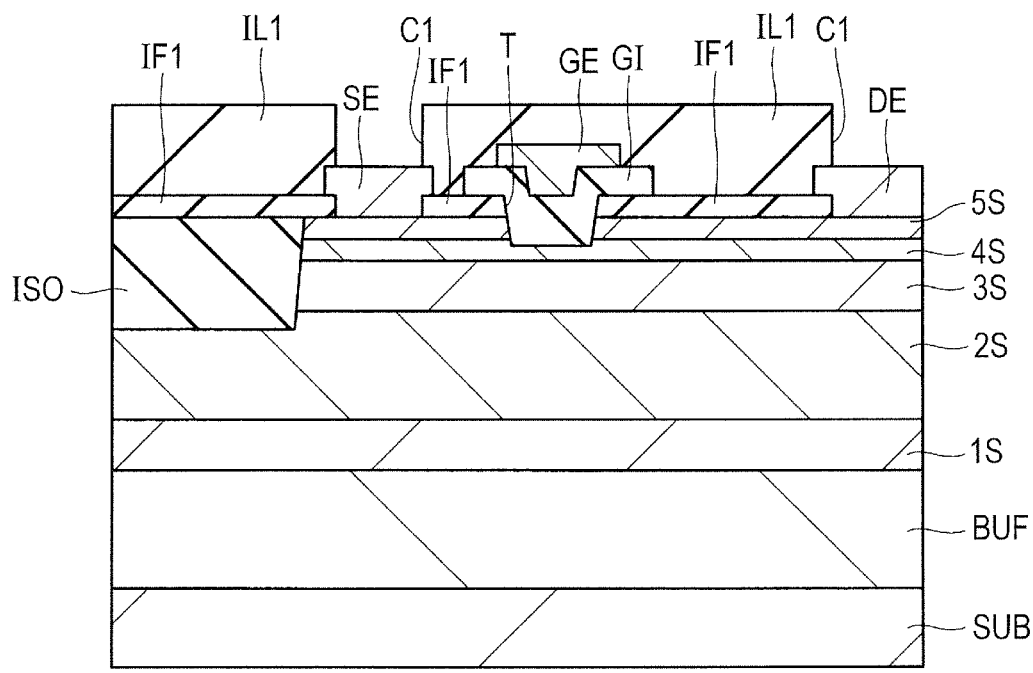
FIG. 8 is a sectional view illustrating the manufacturing process of the semiconductor device of the first embodiment.
Figure 9:
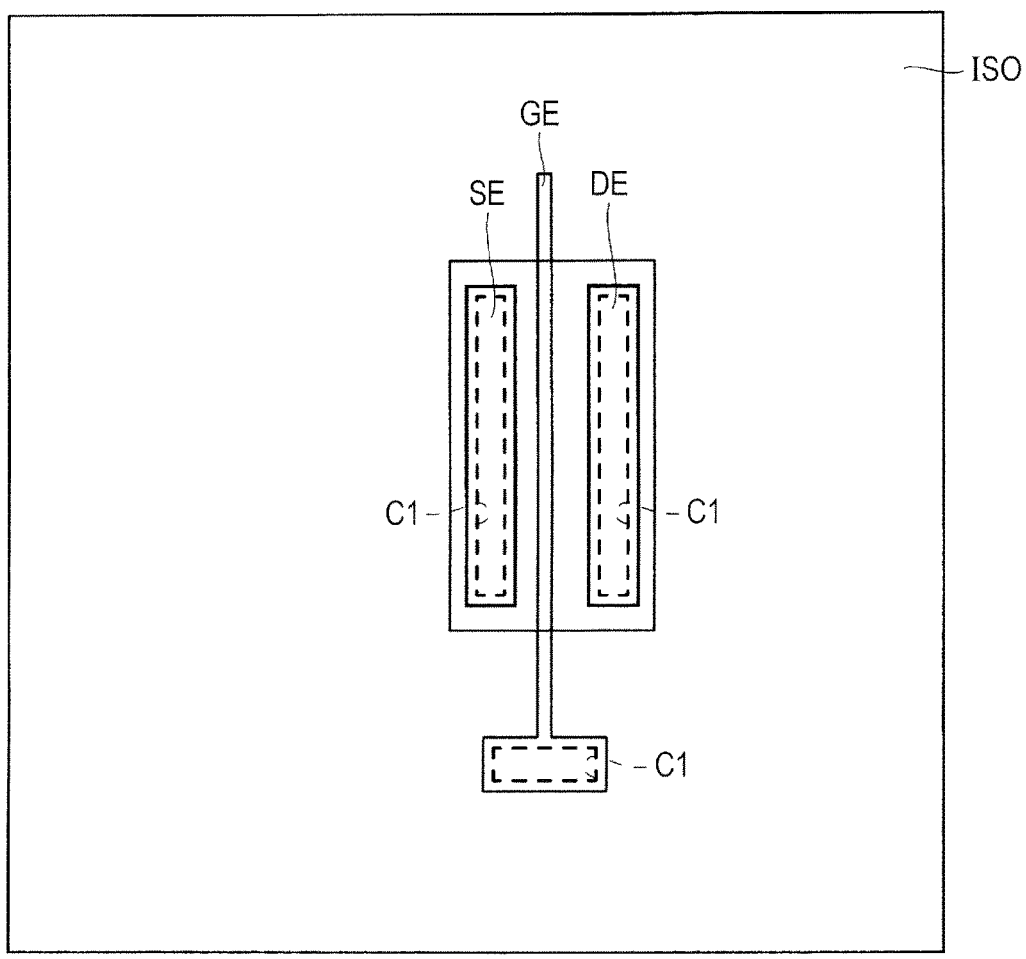
FIG. 9 is a plan view illustrating the manufacturing process of the semiconductor device of the first embodiment.

Subsequently, as shown in FIGS. 8 and 9, for example, a silicon oxide film is deposited about 2000 nm as an interlayer insulating film IL1 on the insulating film IF1 including over the gate electrode GE, the source electrode SE, and the drain electrode DE by a PECVD process or the like. A so-called TEOS film can be used as the silicon oxide film. The TEOS film is a CVD film using tetra ethyl ortho silicate (TEOS) as a material.

Subsequently, a contact hole C1 is formed in the interlayer insulating film IL1 by a photolithography technique and an etching technique. For example, dry etching is performed using a fluorine-based gas. The contact hole C1 is formed on each of the source electrode SE, the drain electrode DE and the gate electrode GE.

Figure 10:
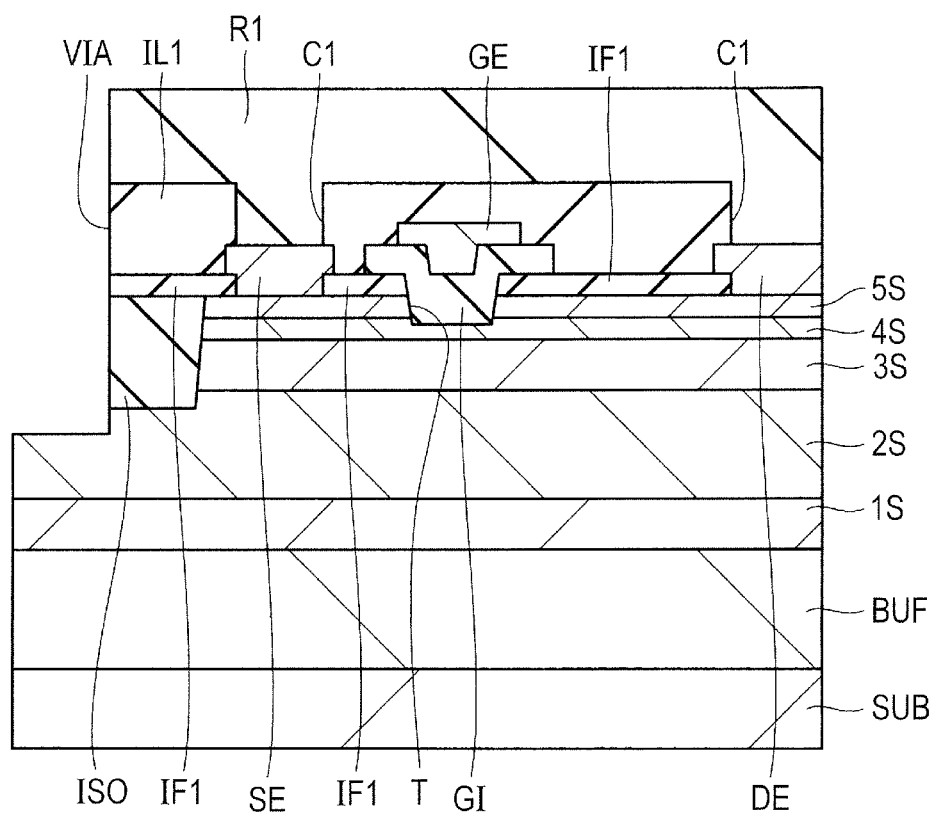
FIG. 10 is a sectional view illustrating the manufacturing process of the semiconductor device of the first embodiment.
Figure 11:
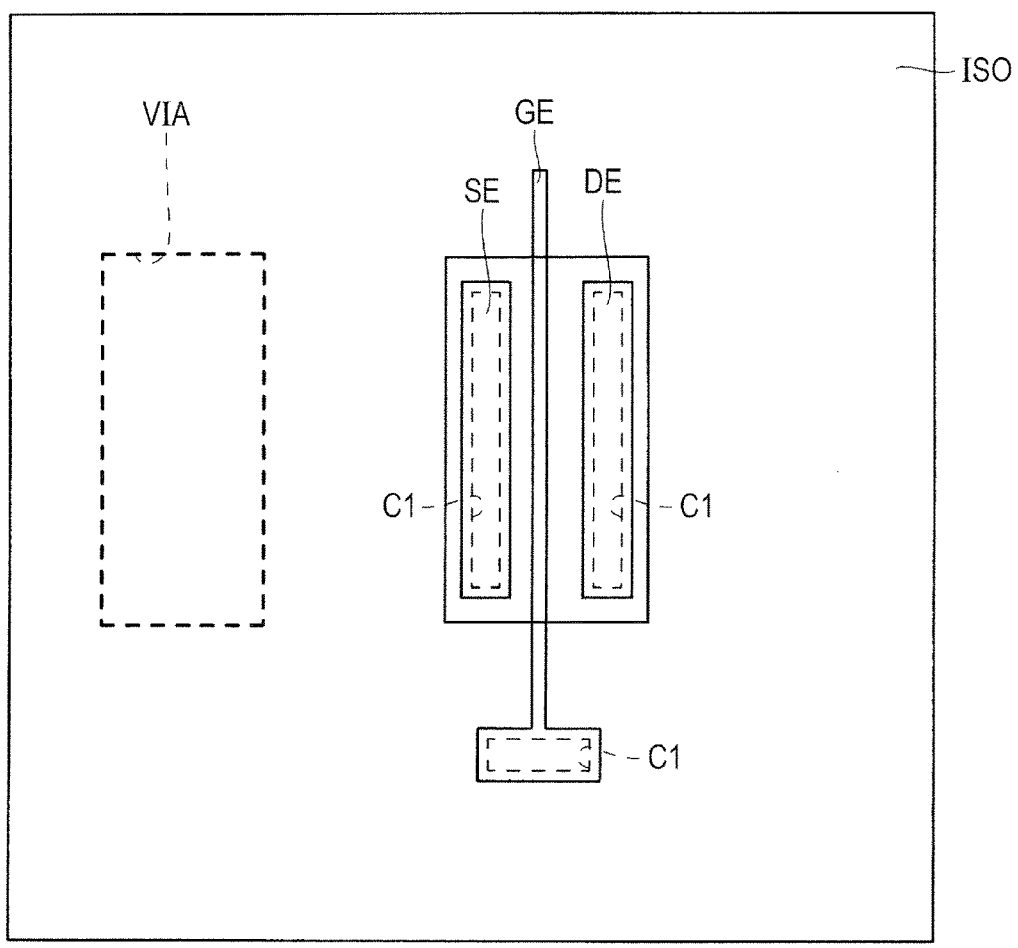
FIG. 11 is a plan view illustrating the manufacturing process of the semiconductor device of the first embodiment.

Subsequently, as shown in FIGS. 10 and 11, a via hole (through hole) VIA is formed. For example, a photoresist film R1 having an opening in a formation region of the via hole VIA is formed on the interlayer insulating film IL1 including within the contact hole C1. Subsequently, each of the interlayer insulating film IL1, the insulating film IF1, the element isolation region ISO, and the second nitride semiconductor layer (voltage clamp layer) 2S is partially etched with the photoresist film R1 as a mask, thereby the via hole VIA is formed. In other words, the via hole VIA is formed, which extends up to the middle of the second nitride semiconductor layer (voltage clamp layer) 2S while penetrating through the interlayer insulating film IL1, the insulating film IF1, and the element isolation region ISO. The interlayer insulating film IL1 and the insulating film IF1 are dry-etched using, for example, a fluorine-based gas, and the element isolation region ISO and the second nitride semiconductor layer (voltage clamp layer) 2S are dry-etched using a chlorine-based gas such as $BCl_3$, for example. Subsequently, the photoresist film R1 is removed. The second nitride semiconductor layer (voltage clamp layer) 2S is exposed from the bottom of the via hole VIA. The source electrode SE, the drain electrode DE, and the gate electrode GE are each exposed from the bottom of the contact hole C1.

Figure 12:
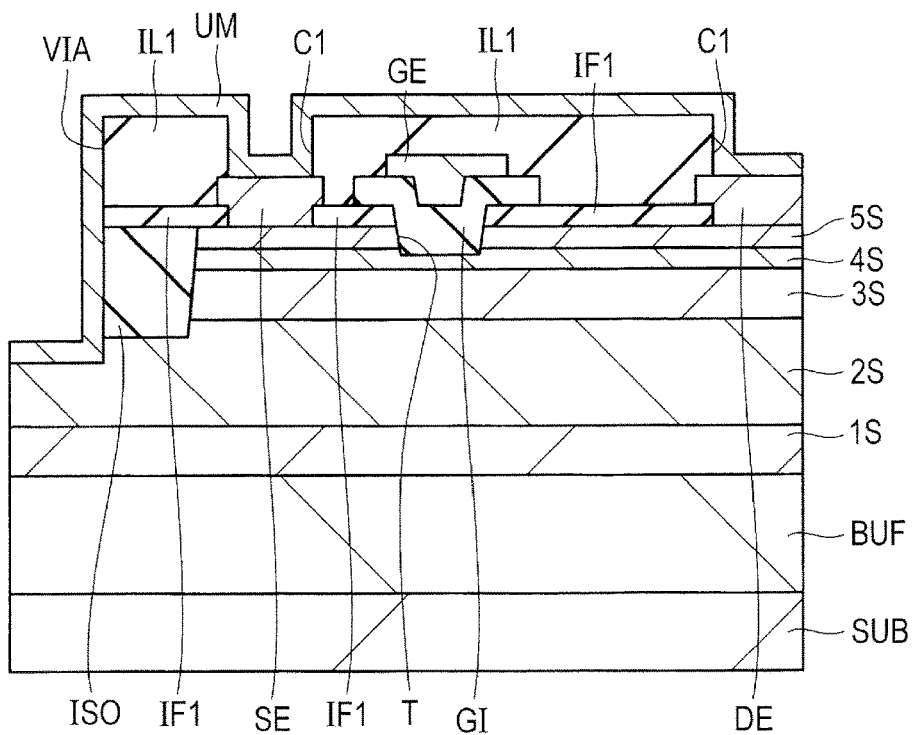
FIG. 12 is a sectional view illustrating the manufacturing process of the semiconductor device of the first embodiment.
Figure 13:
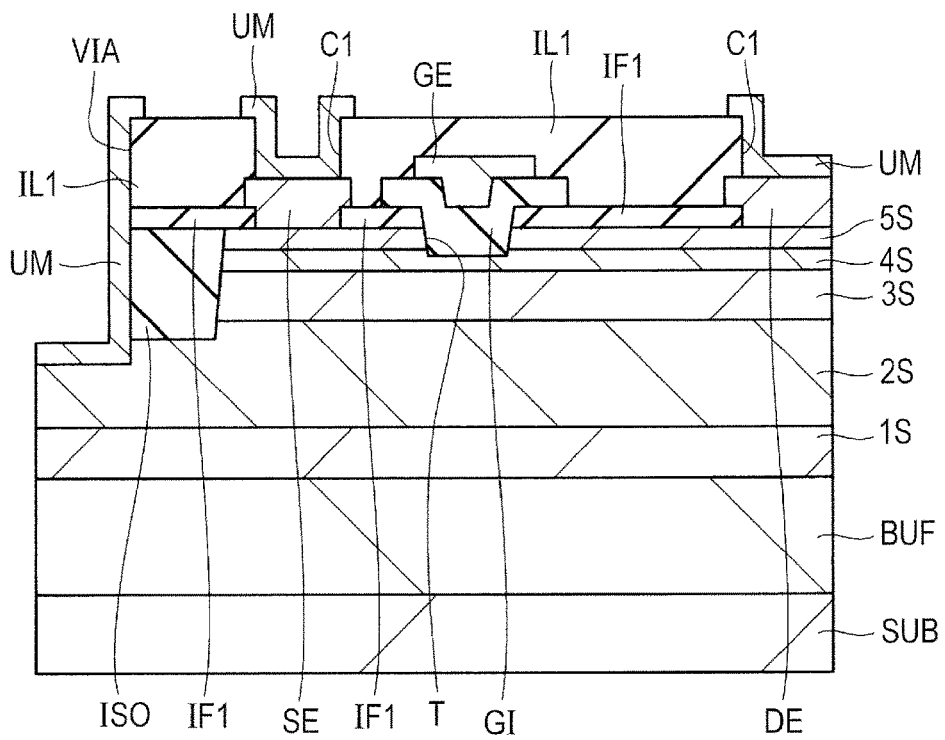
FIG. 13 is a sectional view illustrating the manufacturing process of the semiconductor device of the first embodiment.

Subsequently, as shown in FIGS. 12 to 15, the fourth electrode 4E, the source line (source interconnection) SL, the drain line (drain interconnection) DL, and the gate line (gate interconnection) GL are formed. First, as shown in FIG. 12, for example, a nickel (Ni) film is formed as the underlying metal film UM by a sputtering process or the like. The Ni film has a thickness of, for example, about 50 nm. Subsequently, as shown in FIG. 13, the Ni film is left within the via hole VIA and the contact hole C1 by a photolithography technique and an etching technique. Specifically, the Ni film is left so as to cover the inner wall of each of the via hole VIA and the contact hole C1.

Figure 14:
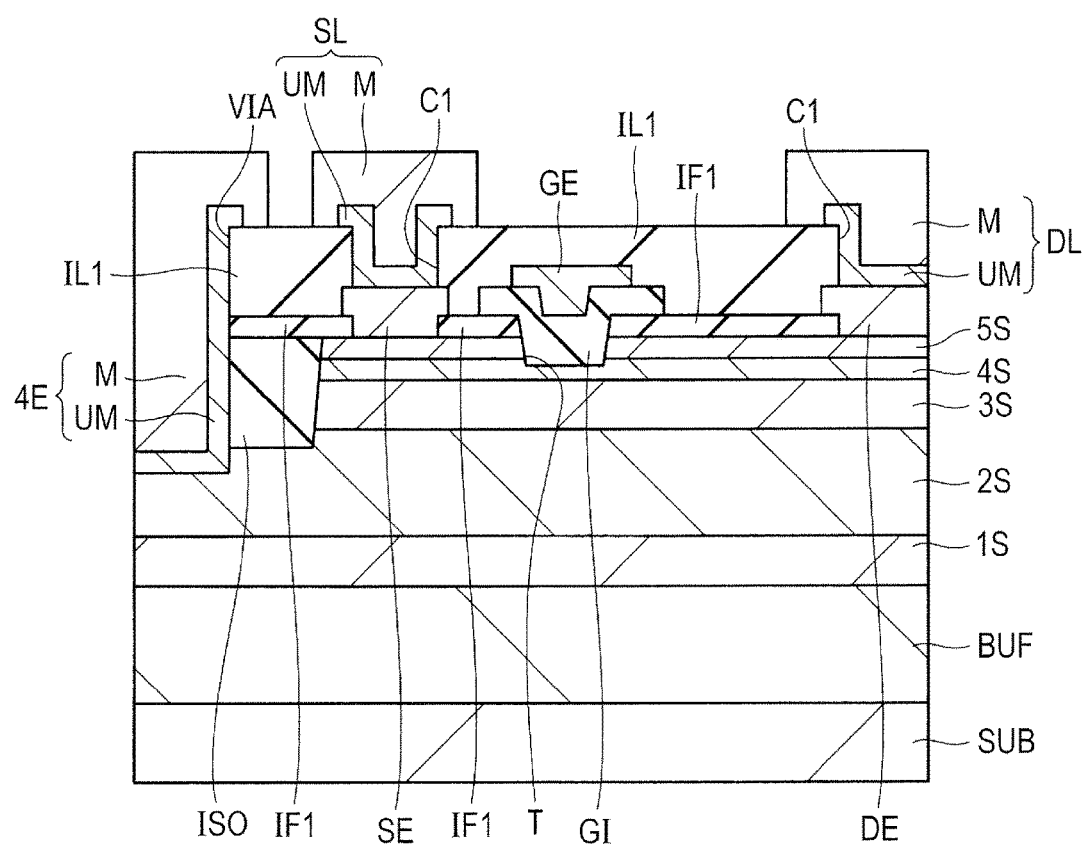
FIG. 14 is a sectional view illustrating the manufacturing process of the semiconductor device of the first embodiment.
Figure 15:
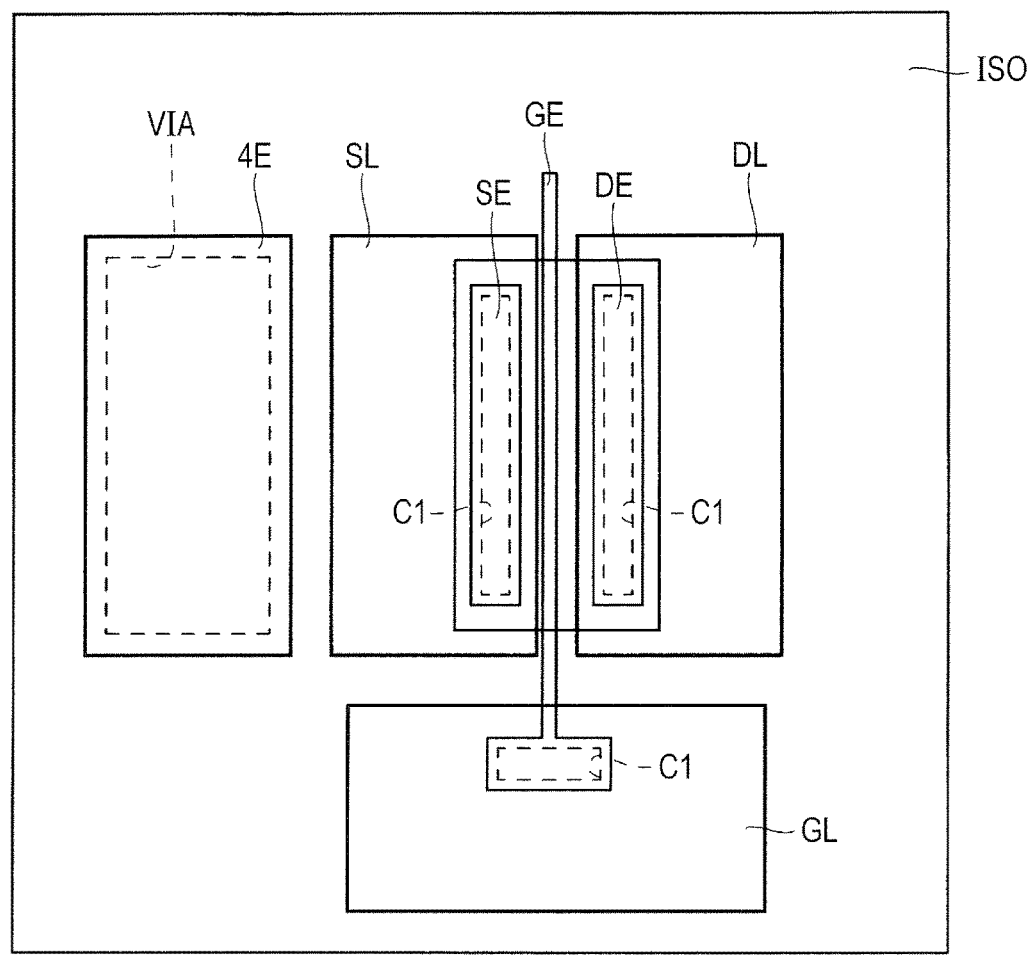
FIG. 15 is a plan view illustrating the manufacturing process of the semiconductor device of the first embodiment.

Subsequently, a conductive film is formed on the interlayer insulating film IL1 including within each of the via hole VIA and the contact hole C1. For example, an AlCu (alloy of Al and Cu) film is formed as the metal film M by a sputtering process or the like. The AlCu film has a thickness of about 1000 nm, for example. Subsequently, the AlCu film is left over the Ni film within each of the via hole VIA and the contact hole C1 by a photolithography technique and an etching technique. Consequently, there are formed the fourth electrode 4E, the source line SL, the drain line DL, and the gate line GL, which each include a film stack of the underlying metal film UM and the metal film M (FIGS. 14 and 15).

Subsequently, an undepicted protective film is formed on the interlayer insulating film IL1 including over the fourth electrode 4E, the source line SL, the drain line DL, and the gate line GL. For example, a silicon oxynitride (SiON) film is deposited as a protective film on the interlayer insulating film IL1 by a CVD process or the like. Subsequently, part of the protective film is removed by a photolithography technique and an etching technique. Specifically, an opening of the protective film is provided on each of the fourth electrode 4E, the source line SL, the drain line DL, and the gate line GL. The opening serves as a pad region (see a second embodiment). A voltage (signal) can be applied through the opening to each of the fourth electrode 4E, the source line SL, the drain line DL, and the gate line GL. For example, the fourth electrode 4E is coupled to an external power supply, and the source pad is grounded.

The semiconductor device of the first embodiment can be formed through the above-described steps. Such steps are merely shown as an example, and the semiconductor device of the first embodiment can be manufactured through other steps.

Operation of the semiconductor device (FIG. 1) of the first embodiment is now described. When a DC voltage is externally applied to the fourth electrode 4E, the second nitride semiconductor layer (voltage clamp layer) 2S has a voltage equal to that of the fourth electrode 4E, and thus serves as a back gate. Consequently, the threshold of the transistor can be controlled.

The thickness of the gate insulating film GI is denoted by ti, the relative dielectric constant thereof is denoted by εi, the distance from the top of the second nitride semiconductor layer (voltage clamp layer) 2S to the channel region (the bottom of the gate insulating film GI) of the MISFET is denoted by tp, the relative dielectric constant of the second nitride semiconductor layer is denoted by εn, and an external DC voltage is denoted by Vsub, and thus variation δVt in the threshold (Vt) can be expressed by equation (1).

$$\delta Vt = (\varepsilon n/tp)/(\varepsilon i/ti) \times Vsub \quad (1)$$

Figure 16:
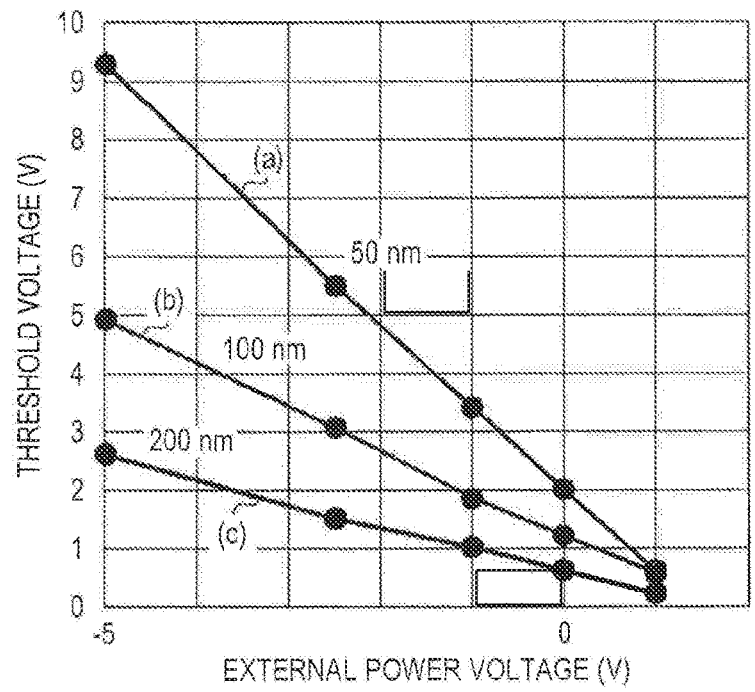
FIG. 16 is a graph illustrating a relationship between an external power voltage and a threshold voltage.

FIG. 16 is a graph showing a relationship between an external power voltage and a threshold voltage. The horizontal axis represents the external power voltage (V), and the vertical axis represents the threshold voltage (V). Specifically, FIG. 16 shows variations in the threshold voltage when a negative voltage (external power voltage) is mainly applied from the external DC power supply as the voltage application unit 2P to the fourth electrode 4E in the semiconductor device (FIG. 1) of the first embodiment. Assuming the thickness of the gate insulating film (including $Al_2O_3$ having a relative dielectric constant of 10 herein) is 100 nm, a graph (a) shows the case of the thickness of the third nitride semiconductor layer 3S of 50 nm, a graph (b) shows the case of the thickness of the third nitride semiconductor layer 3S of 100 nm, and a graph (c) shows the case of the thickness of the third nitride semiconductor layer 3S of 200 nm. The voltage of the source electrode SE is assumed to be the ground voltage (0 V).

FIG. 16 reveals that when the external power voltage is varied from +1 V to −5 V, the threshold voltage increases with a decrease in the external power voltage in any of the graphs (a) to (c).

Figure 17:
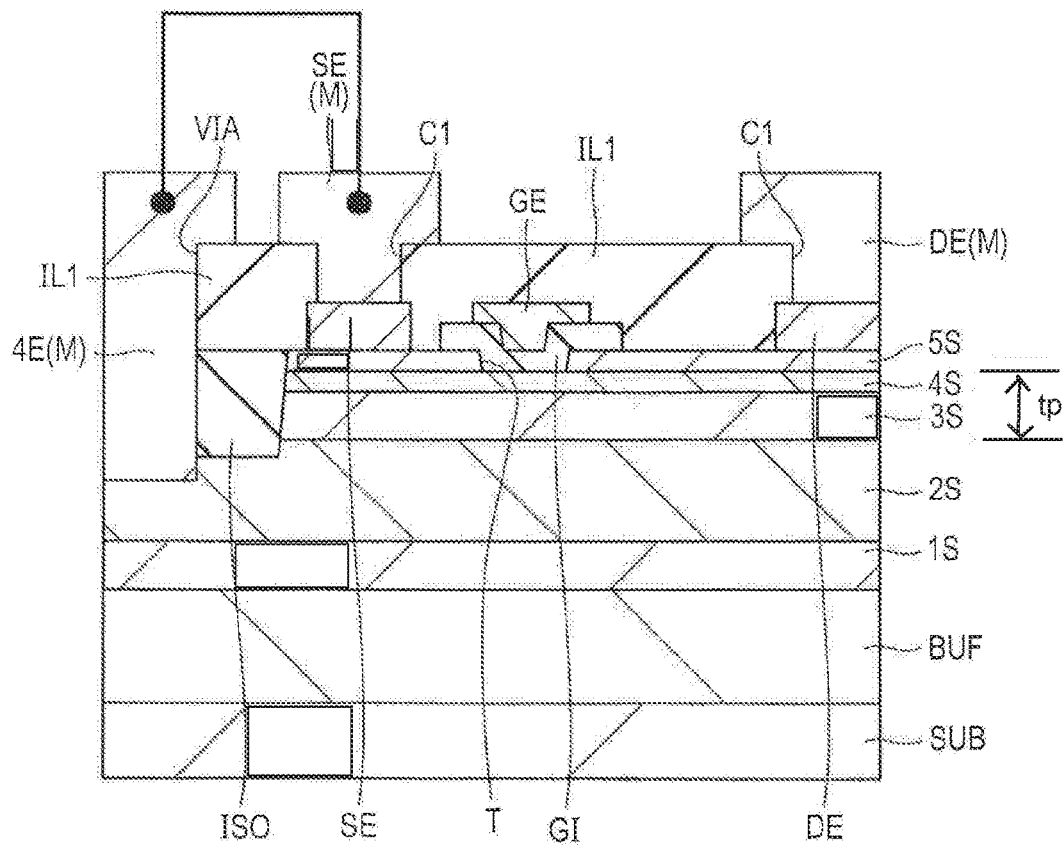
FIG. 17 is a sectional view illustrating a configuration of a semiconductor device of a first comparative example.

FIG. 17 is a sectional view illustrating a configuration of a semiconductor device of a first comparative example of the first embodiment. Any portion corresponding to that in FIG. 1 is denoted by the same reference numeral, and duplicated description is omitted. When the source electrode SE (0 V) is coupled to the fourth electrode 4E as shown in FIG. 17, the external power voltage in FIG. 16 is correspondingly 0 V. When the external power voltage is 0 V, the threshold is +2.0V, +1.2V, and +0.6V for the thickness of the third nitride semiconductor layer 3S of 50 nm, 100 nm, and 200 nm, respectively. In this way, although the threshold increases to +2.0 V with a decrease in thickness of the gate insulating film, the target threshold in a range of 2 to 3 V cannot be achieved.

On the other hand, when the distance tp from the top of the second nitride semiconductor layer (voltage clamp layer) 2S to the channel region (the bottom of the gate insulating film GI) of the MISFET is decreased, the channel resistance of the MISFET disadvantageously increases due to the second nitride semiconductor layer (voltage clamp layer) 2S containing the p-type impurity.

On the other hand, the negative voltage is independently applied to the second nitride semiconductor layer (voltage clamp layer) 2S via the fourth electrode 4E as in the first embodiment, thereby the threshold can be increased above +2.0 V (FIG. 16). For example, even if the thickness of the third nitride semiconductor layer 3S of 200 nm, the threshold can be adjusted to +2.6 V for the external power voltage of −5 V. When the external power voltage is −2.5 V for the thickness of the third nitride semiconductor layer 3S of 100 nm, the threshold can be adjusted to +3.1 V. When the external power voltage is −1.0 V for the thickness of the third nitride semiconductor layer 3S of 50 nm, the threshold can be adjusted to +3.4 V. In this way, a target threshold of more than 2 V can be achieved.

Furthermore, in the first embodiment, it is possible to control the threshold by adjusting the external power voltage, and sufficiently provide the distance tp from the top of the second nitride semiconductor layer (voltage clamp layer) 2S to the channel region (the bottom of the gate insulating film GI) of the MISFET. For example, the distance tp can be adjusted to nm or more. It is therefore possible to suppress deterioration in properties of the MISFET, such as an increase in channel resistance due to the p-type impurity.

In the first embodiment, as described above, it is possible to achieve the threshold in a range of, for example, more than 2 V which is the threshold of the Si device. The MISFET including the nitride semiconductor as in the first embodiment has a bandgap as large as 3.4 eV, and includes the nitride semiconductor having a dielectric breakdown strength about 10 times higher than that of Si, which makes it possible to adjust the withstand voltage between the source and the drain to 650 V or higher during an off state. Since the insulating film is not sandwiched between the channel of the MISFET and the second nitride semiconductor layer (voltage clamp layer) 2S containing the p-type impurity, holes generated during transistor operation are not accumulated in the vicinity of the channel layer. As a result, holes diffuse into the second nitride semiconductor layer (voltage clamp layer) 2S containing the p-type impurity, and are then discharged to the outside from the fourth electrode 4E. This reduces fluctuations in properties during operation.

Figure 18A:
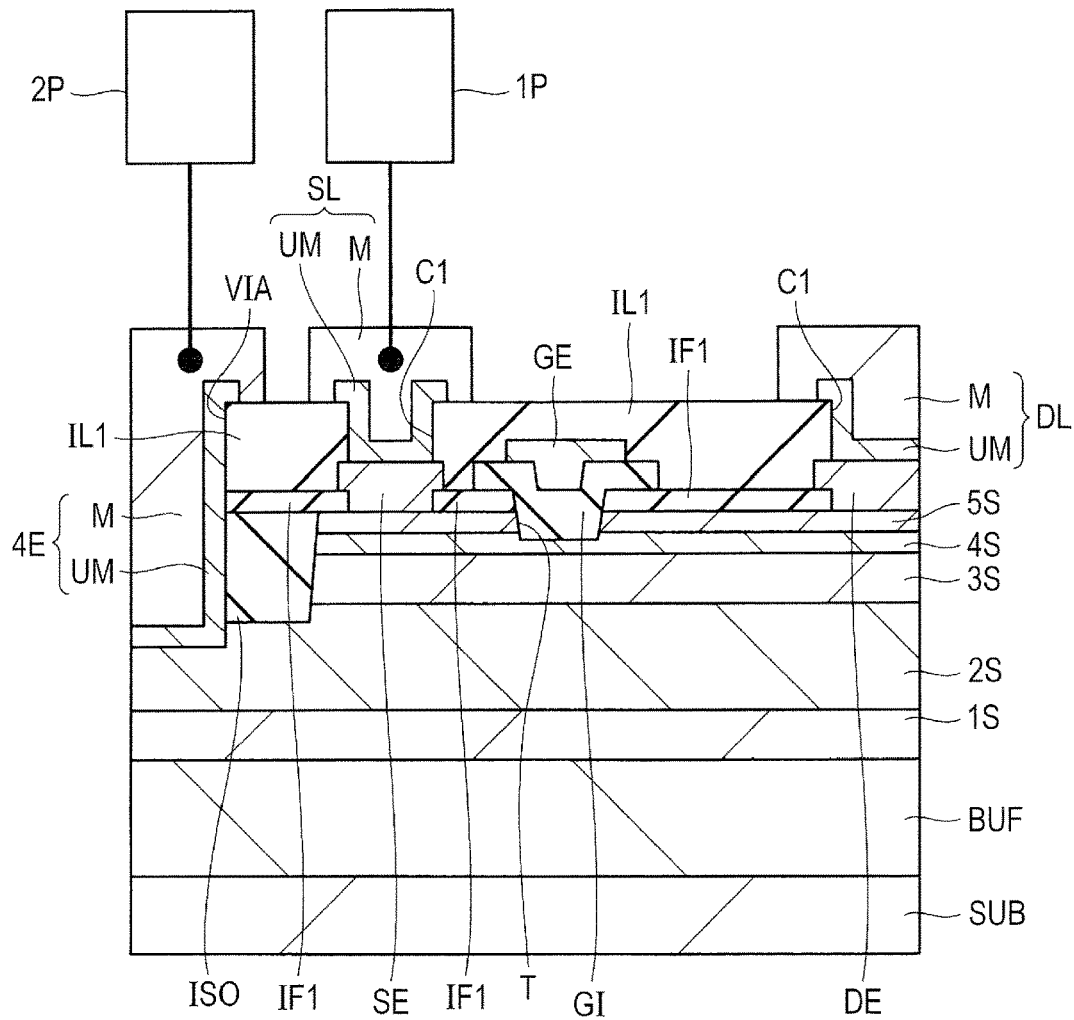
FIGS. 18A and 18B illustrate the configuration and a band diagram directly below a gate electrode, respectively, of the semiconductor device of the first embodiment.
Figure 18B:
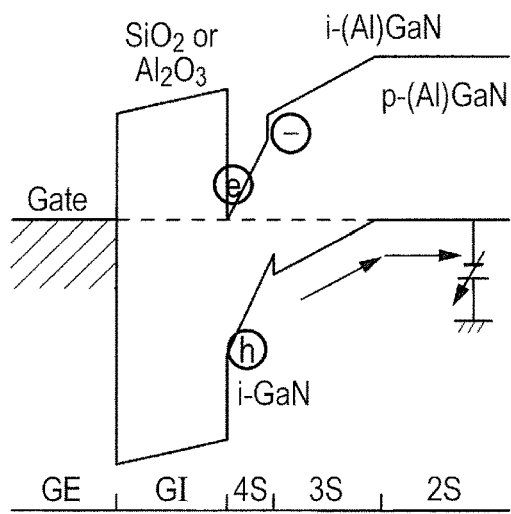
Figure 19A:
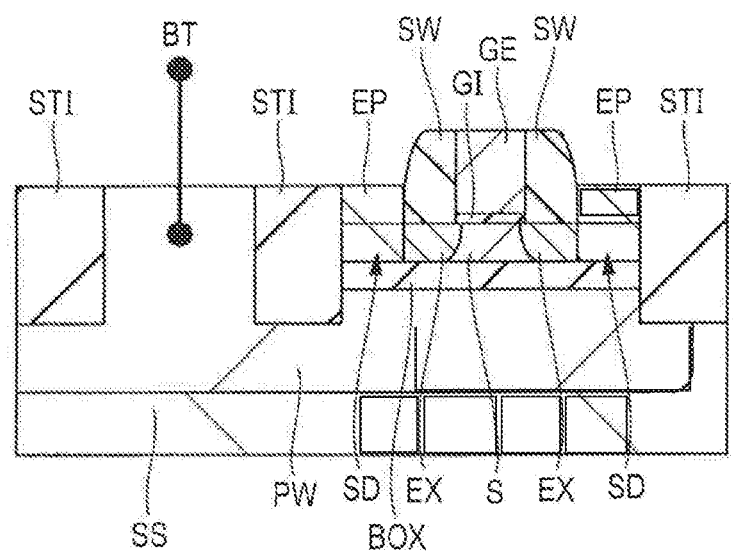
FIGS. 19A and 19B illustrate a configuration and a band diagram directly below a gate electrode, respectively, of a semiconductor device of a second comparative example.
Figure 19B:
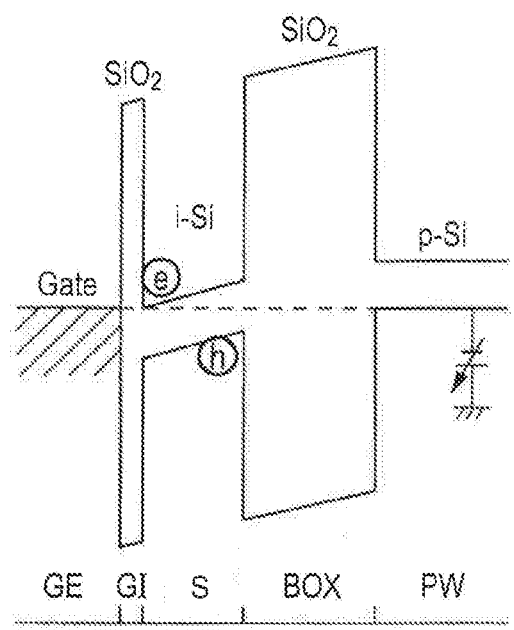
Figure 20A:
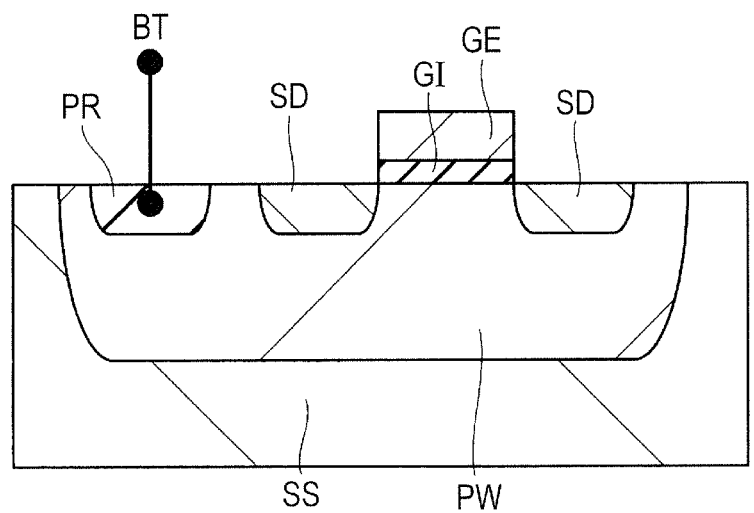
FIGS. 20A and 20B illustrate a configuration and a band diagram directly below a gate electrode, respectively, of a semiconductor device of a third comparative example.
Figure 20B:
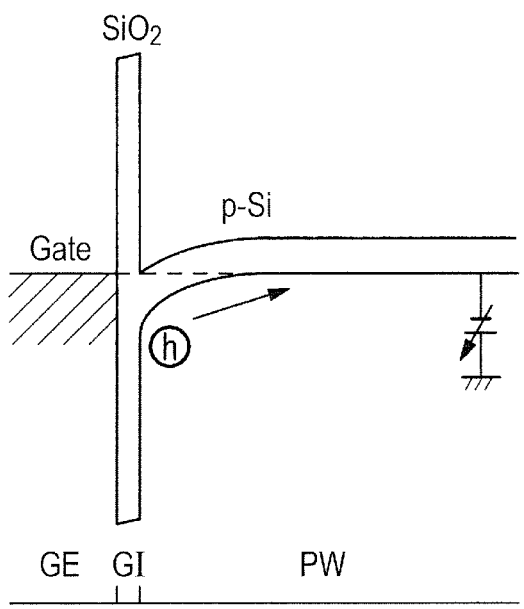

FIGS. 18A and 18B illustrate a configuration and a band diagram directly below the gate electrode, respectively, of the semiconductor device of the first embodiment. FIGS. 19A and 19B illustrate a configuration and a band diagram directly below a gate electrode, respectively, of a semiconductor device of a second comparative example. FIGS. 20A and 20B illustrate a configuration and a band diagram directly below a gate electrode, respectively, of a semiconductor device of a third comparative example. FIGS. 18A, 19A, and 20A each show a sectional view, and FIGS. 18B, 19B, and 20B each show a band diagram.

FIG. 19A shows a Si device, a MISFET formed on a so-called SOI substrate, and FIG. 20A shows another Si device, a MISFET formed on a so-called bulk substrate.

The SOI substrate includes a support substrate SS made of silicon (Si) or the like, an insulating layer BOX on the support substrate SS, and a thin semiconductor layer S made of Si on the insulating layer BOX. The MISFET has a gate electrode GE formed on the semiconductor layer S with a gate insulating film GI in between, and a source region and a drain region formed in the semiconductor layer S on both sides of the gate electrode GE. The source and drain regions each have an LDD structure. Specifically, the source and drain regions each include an n-type low-concentration impurity region EX formed in a self-aligned manner with respect to the gate electrode GE, and an n-type high-concentration impurity region SD formed in a self-aligned manner with respect to a composite body including the gate electrode GE and a sidewall film SW on the sidewall of the gate electrode GE. The n-type high-concentration impurity region SD has an impurity concentration higher than that of the n-type low-concentration impurity region EX. In this exemplary case, an epitaxial layer EP containing an n-type impurity (for example, phosphorus (P) or arsenic (As)) at a high concentration is disposed on the semiconductor layer S on either side of the gate electrode GE. Hence, the n-type high-concentration impurity region SD includes the epitaxial layer EP and the semiconductor layer S.

A p-well PW containing a p-type impurity is disposed in the support substrate SS below the semiconductor layer S configuring the active region, and a bias voltage is applied to the p-well PW via the bias terminal BT, thereby the threshold can be adjusted (see FIG. 19). The MISFET formed on the bulk substrate has a configuration similar to that of the MISFET formed on the SOI substrate (see FIG. 20). With the MISFET formed on the bulk substrate, the same reference numeral is given to each portion corresponding to that of the MISFET formed on the SOI substrate, and duplicated description is omitted. For the MISFET formed on the bulk substrate, a bias voltage may also be applied to the p-well PW via a bias terminal BT. A region PR coupled to the bias terminal BT is a p-type high-concentration impurity region.

As is clear from comparison between FIG. 19B and FIG. 20B, in the case of the MISFET formed on the SOI substrate, although the MISFET has improved properties compared with the MISFET formed on the bulk substrate, the insulating layer BOX acts as a large barrier and thus kink tends to occur due to holes (h) generated by impact ionization, leading to variations in the properties. In contrast, in the first embodiment, since holes (h) generated by impact ionization can escape, kink is less likely to occur, leading to few variations in the properties (see FIG. 18B).

Second Embodiment

Although the first embodiment (FIG. 15) is configured such that, in planar view, one linear source electrode SE is provided on one side of one linear gate electrode GE, one linear drain electrode DE is provided on the other side thereof, and the respective interconnections (the source line SL and the drain line DL) are provided on such electrodes, the layout of the electrodes and the interconnections can be appropriately altered or modified. For example, each interconnection may have a comblike shape as a planar shape.

Figure 21:
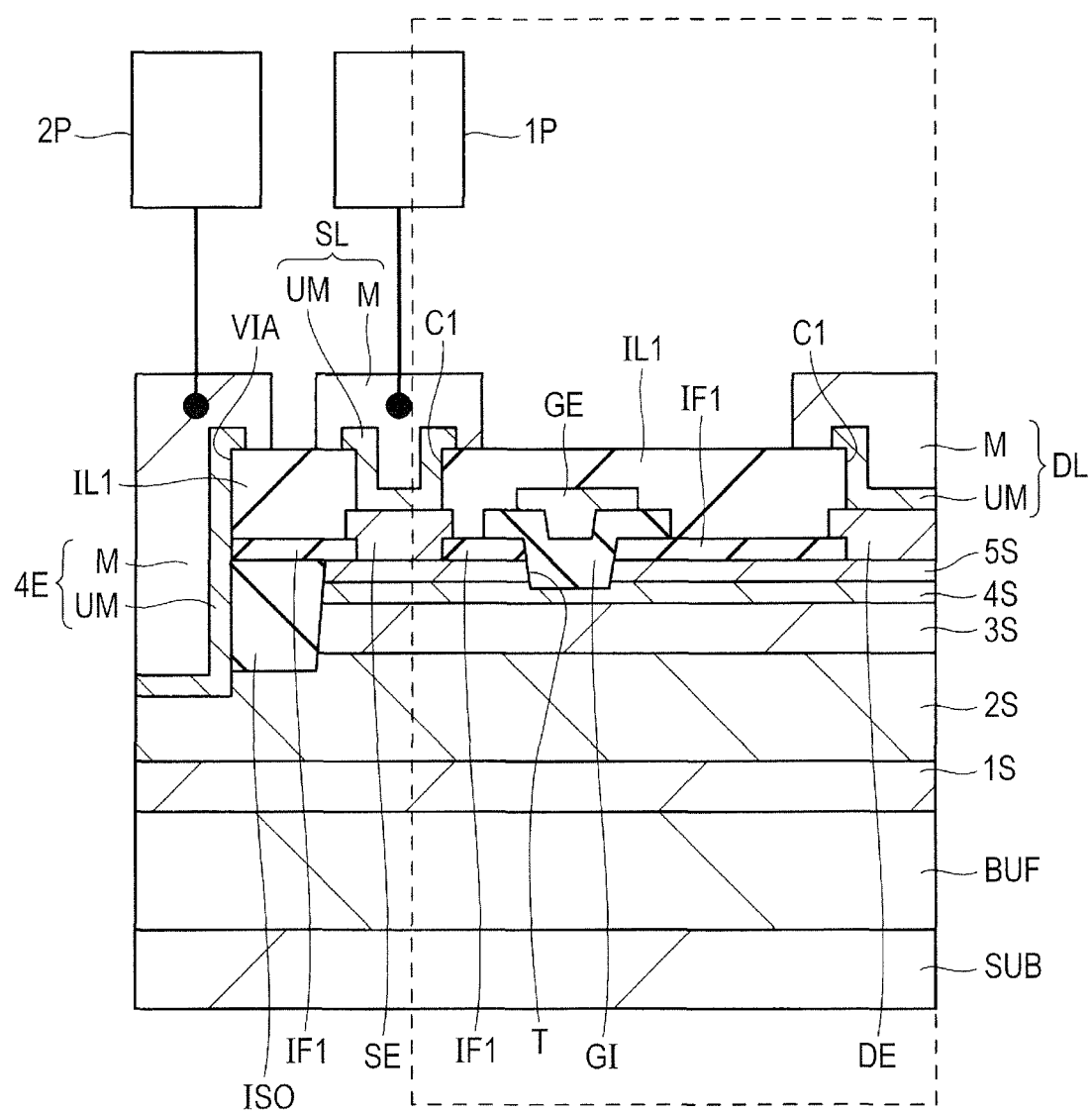
FIG. 21 is a sectional view illustrating a configuration of a semiconductor device of a second embodiment.

FIG. 21 is a sectional view illustrating a configuration of a semiconductor device of a second embodiment. FIGS. 22 to 25 are each a plan view illustrating the configuration of the semiconductor device of the second embodiment.

The sectional view of FIG. 21 is the same as that in the first embodiment (FIG. 1). The broken-line region in the sectional view of FIG. 21 corresponds to a portion along A-A in the plan view of FIG. 22. The planar layout of the semiconductor device of the second embodiment is now described with reference to FIG. 22 or others.

Figure 22:
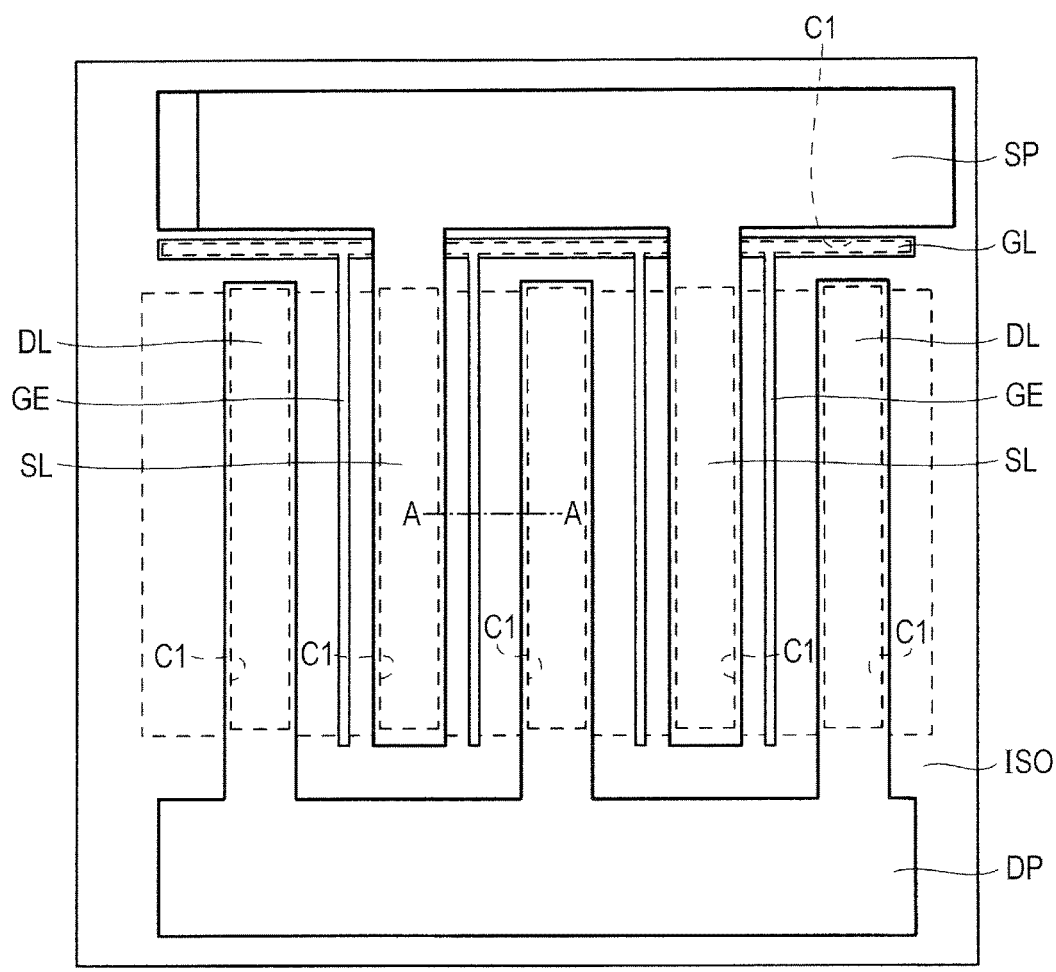
FIG. 22 is a plan view illustrating the configuration of the semiconductor device of the second embodiment.

As shown in FIG. 22, the planar shape of the drain line DL is a rectangular shape having long sides in a Y direction. A plurality of linear drain lines DL are arranged at a constant interval in an X direction. The planar shape of the source line SL is a rectangular shape having long sides in the Y direction. A plurality of linear source lines SL are arranged at a constant interval in the X direction. The source electrodes SE and the drain electrodes DE are alternately arranged in the X direction.

A contact hole C1 being a coupling part with the drain electrode DE is disposed below the drain line DL. The planar shape of the contact hole C1 is a rectangular shape having long sides in the Y direction, for example. A contact hole C1 being a coupling part with the source electrode SE is disposed below the source line SL. The planar shape of the contact hole C1 is a rectangular shape having long sides in the Y direction.

A gate electrode GE is disposed between the drain electrode (DE) under the drain line DL and the source electrode (SE) under the source line SL. The gate electrode GE has a rectangular shape having long sides in the Y direction. Two (a pair of) gate electrodes GE are disposed on both sides of one source electrode SE. In this way, two gate electrodes GE are repeatedly disposed in correspondence to the source electrodes SE.

The drain lines DL are coupled together by a drain pad (also referred to as a terminal part) DP. The drain pad DP is disposed so as to extend in the X direction on one end side (the lower side in FIG. 22) of the drain electrode DE. In other words, the drain lines DL are disposed so as to protrude in the Y axis direction from the drain pad DP extending in the X direction. Such a shape may be referred to as comblike shape.

The source lines SL are coupled together by a source pad (also referred to as a terminal part) SP. The source pad SP is disposed so as to extend in the X direction on the other end side (the upper side in FIG. 22) of the source electrode SE. In other words, a plurality of source lines SL are disposed so as to protrude in the Y axis direction from the source pad SP extending in the X direction. Such a shape may be referred to as comblike shape.

The gate electrodes GE are coupled together by the gate line GL. The gate line GL is disposed so as to extend in the X direction on one end side (the upper side in FIG. 22) of the gate electrode GE. In other words, the gate electrodes GE are disposed so as to protrude in the Y axis direction from the gate line GL extending in the X direction. For example, the gate line GL is coupled to a gate pad GP provided on one side (the lower side in FIG. 23) in the X direction of the gate line GL.

The source lines SL, the drain lines DL, and the gate electrodes GE are mainly disposed on an active region (a broken line region in FIG. 22) surrounded by the element isolation region ISO. The planar shape of the active region is a rectangular shape having long sides in the X direction. On the other hand, the drain pad DP, the gate line GL, and the source pad SP are disposed on the element isolation region ISO. The gate line GL is disposed between the active region and the source pad SP.

Figure 23:
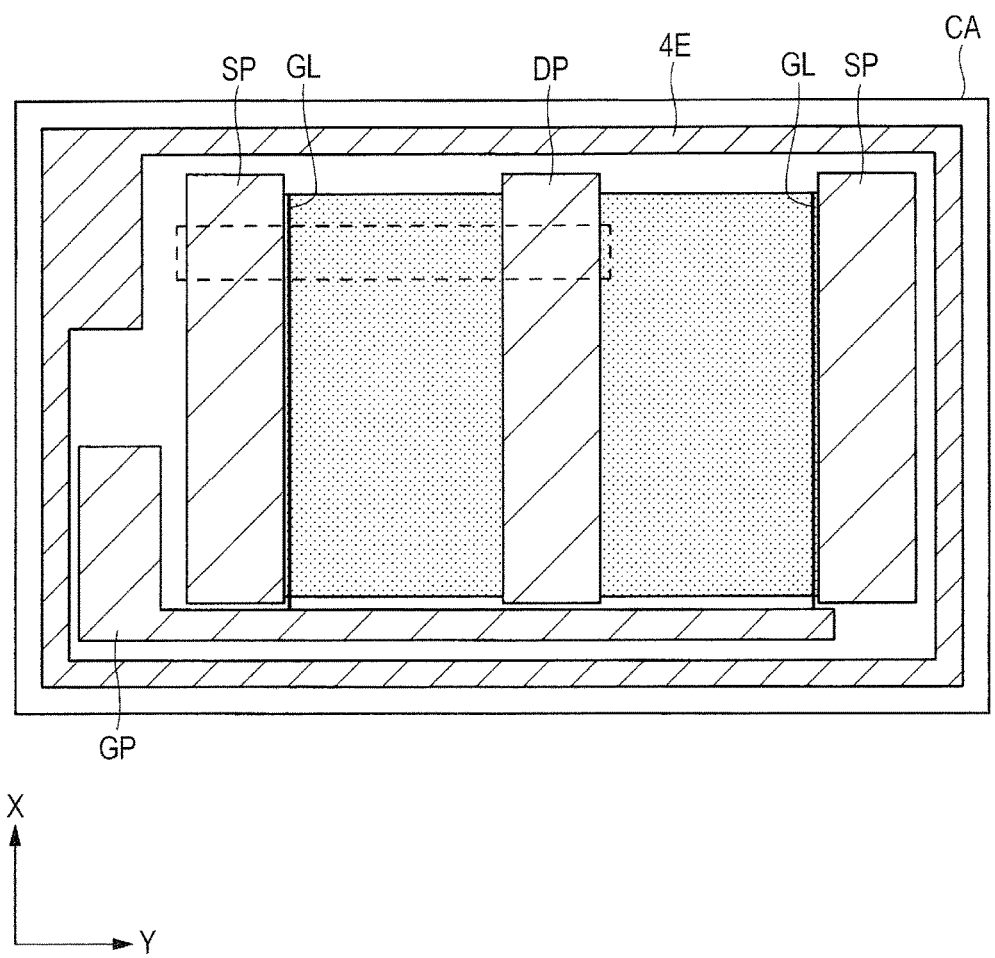
FIG. 23 is a plan view illustrating the configuration of the semiconductor device of the second embodiment.

As shown in FIG. 23, the source pad SP, the drain pad DP, and the source pad SP are arranged in order in the Y direction in a chip area CA. The chip area CA includes a plurality of rectangular regions provided on a wafer (substrate). A semiconductor chip is cut out from the wafer by dicing a scribe region between the chip areas CA.

The broken-line region in FIG. 23 corresponds to the layout of FIG. 22. When the X and Y directions in FIG. 22 are made corresponding to those in FIG. 23, the layout as shown in FIG. 24 is given.

Figure 24:
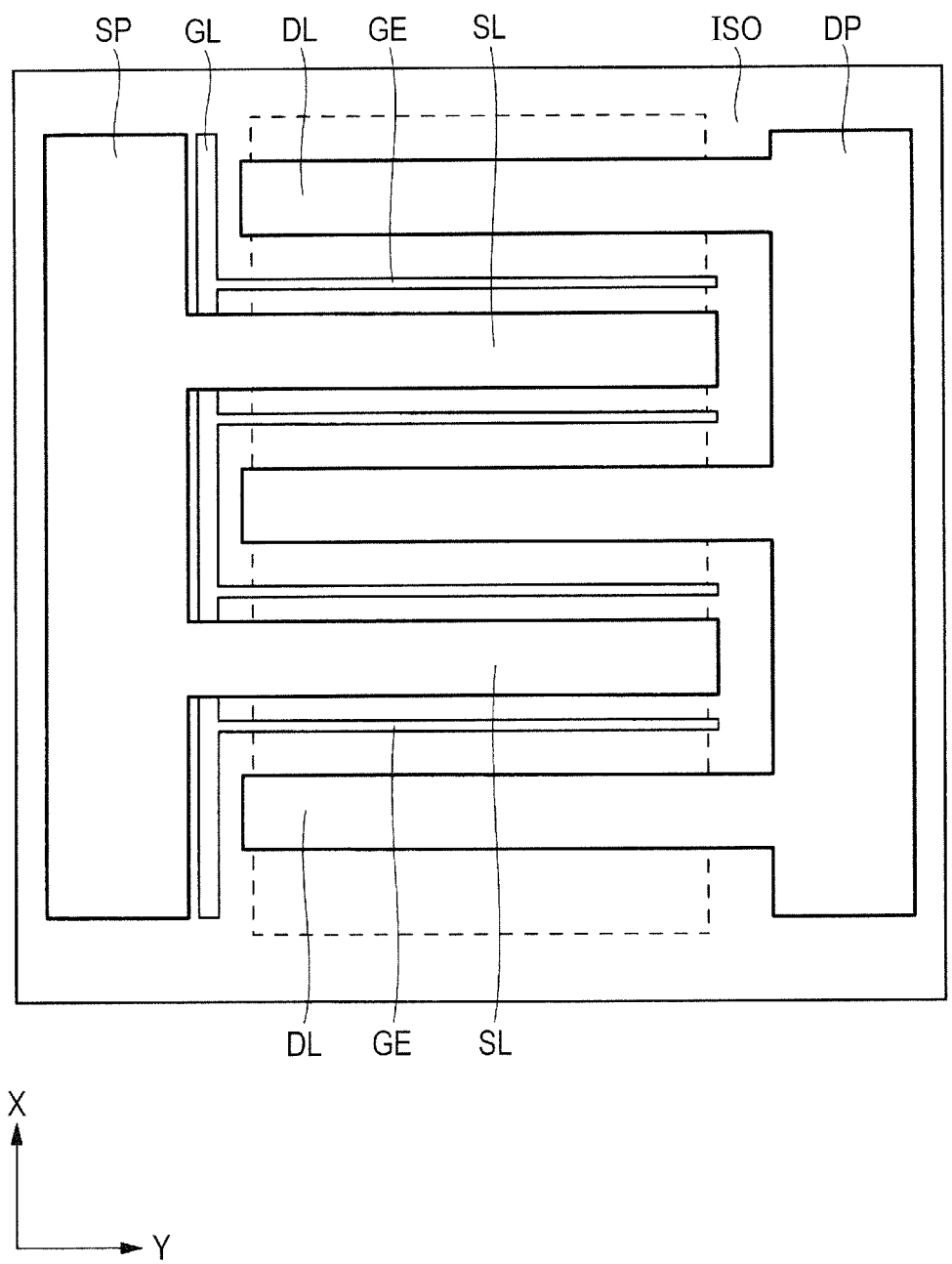
FIG. 24 is a plan view illustrating the configuration of the semiconductor device of the second embodiment.

The drain lines DL, the source lines SL, and the gate electrodes GE as shown in FIG. 24 are thus disposed between the source pad SP and the drain pad DP. The gate line GL extending in the X direction is coupled to the gate pad GP provided on the lower side in FIG. 23 or 24. The gate pad GP has a wide portion extending in the X direction. The source pad SP, the drain pad DP, and the gate pad GP are each coupled to an external terminal via a wire. The fourth electrode 4E is provided in a rectangular annular shape along the end of the chip area CA, for example. The fourth electrode 4E also has a wide portion extending in the X direction. For example, the fourth electrode 4E is coupled to an external terminal via a wire by using the wide portion.

Figure 25:
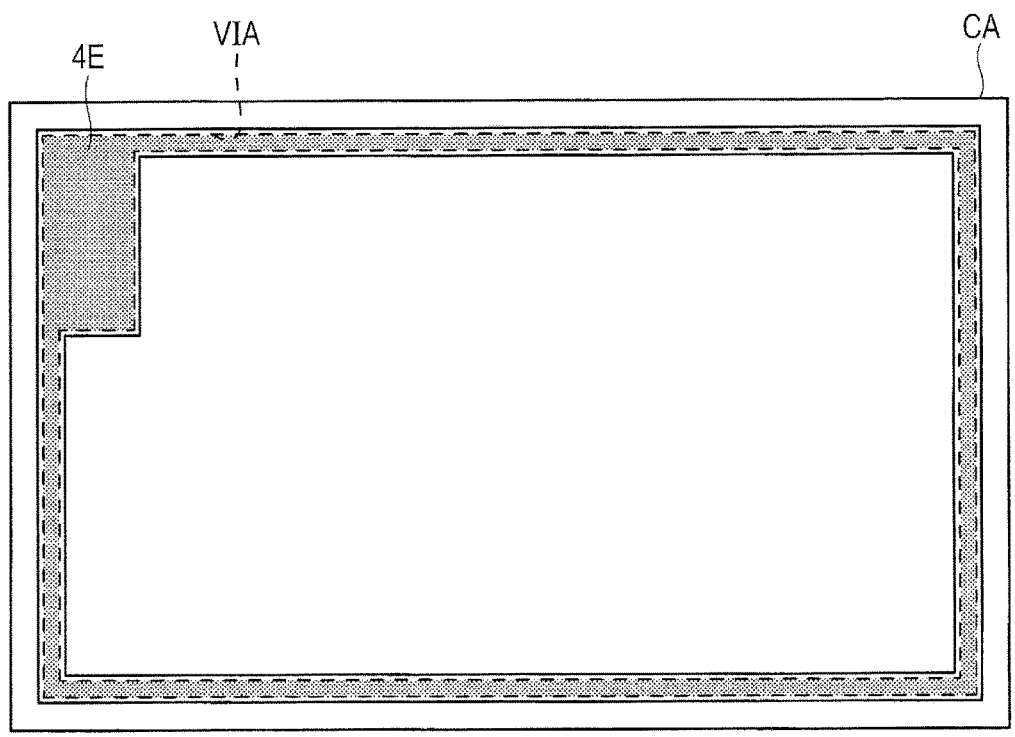
FIG. 25 is a plan view illustrating the configuration of the semiconductor device of the second embodiment.

As shown in FIG. 25, a via hole VIA is provided in the formation region of the fourth electrode 4E. The bottom (the gray region in FIG. 25) of the via hole VIA is a coupling region between the second nitride semiconductor layer (voltage clamp layer) 2S and the fourth electrode 4E.

The fourth electrode 4E and the via hole VIA are thus provided along the end of the chip area CA so as to surround the internal element (MISFET), thereby the voltage of the second nitride semiconductor layer (voltage clamp layer) 2S can be effectively fixed to a voltage lower than the voltage (source voltage) applied to the source electrode SE, leading to easy threshold control.

When the via hole VIA is provided along the end of the chip area CA as shown in FIG. 25, the shortest distance between the end of the chip area CA and the end of the via hole VIA is desirably 0.01 to 0.2 mm. When the via hole VIA is provided on the outer peripheral portion of the chip area CA, a defect may occur at about 0.01 mm inwardly from the outer periphery due to processing for chip formation. If the via hole VIA is provided within the chip area CA at 0.2 mm or more from the end of the chip area CA, a layout of other pads is limited, and a crack tends to occur because the via hole VIA is provided excessively inside, which may affect internal elements. Hence, as described above, the shortest distance between the end of the chip area CA and the end of the via hole VIA is preferably 0.01 to 0.2 mm.

For example, the MISFET (element for evaluating the basic properties) of the first embodiment (FIG. 15) has a gate width of 40 μm, and shows an output current of about 10 mA (0.25 A/mm), for example. On the other hand, when the MISFET of the second embodiment has a gate width of, for example, 1 mm and two repetition regions each having a width of 2.5 mm while a repetition period is, for example, 20 μm, the total gate width is 1 mm×(2.5 mm/0.02 mm)×2=250 mm. As described above, the fourth electrode 4E that controls the threshold is in electrical contact with the second nitride semiconductor layer (voltage clamp layer) 2S containing the p-type impurity at the outer periphery of the semiconductor chip. A DC voltage from the external power supply is applied to the pad (wide portion) of the fourth electrode 4E. For example, a maximum of 60 A can be extracted in a MISFET that allows a current density of 0.25 A/mm. In this way, a threefold margin for the operation of 20 A is allowed. Measurement of the threshold of the semiconductor device of the second embodiment reveals that a relationship between the external power voltage and the threshold voltage (see FIG. 16) is similar to that of the MISFET (element for evaluating the basic properties) of the first embodiment (FIG. 15).

In this way, in the second embodiment, it is also possible to increase the threshold by independently applying a negative voltage to the second nitride semiconductor layer (voltage clamp layer) 2S via the fourth electrode 4E (FIG. 16).

Third Embodiment

Although a recess-gate semiconductor device is exemplified in each of the first and second embodiments, a semiconductor device having another configuration can also be used. For example, a junction-type semiconductor device, in which a gate junction layer is disposed under a gate electrode, may be used as in a third embodiment.

A semiconductor device of the third embodiment is now described in detail with reference to the accompanying drawings.

Description of Structure

Figure 26:
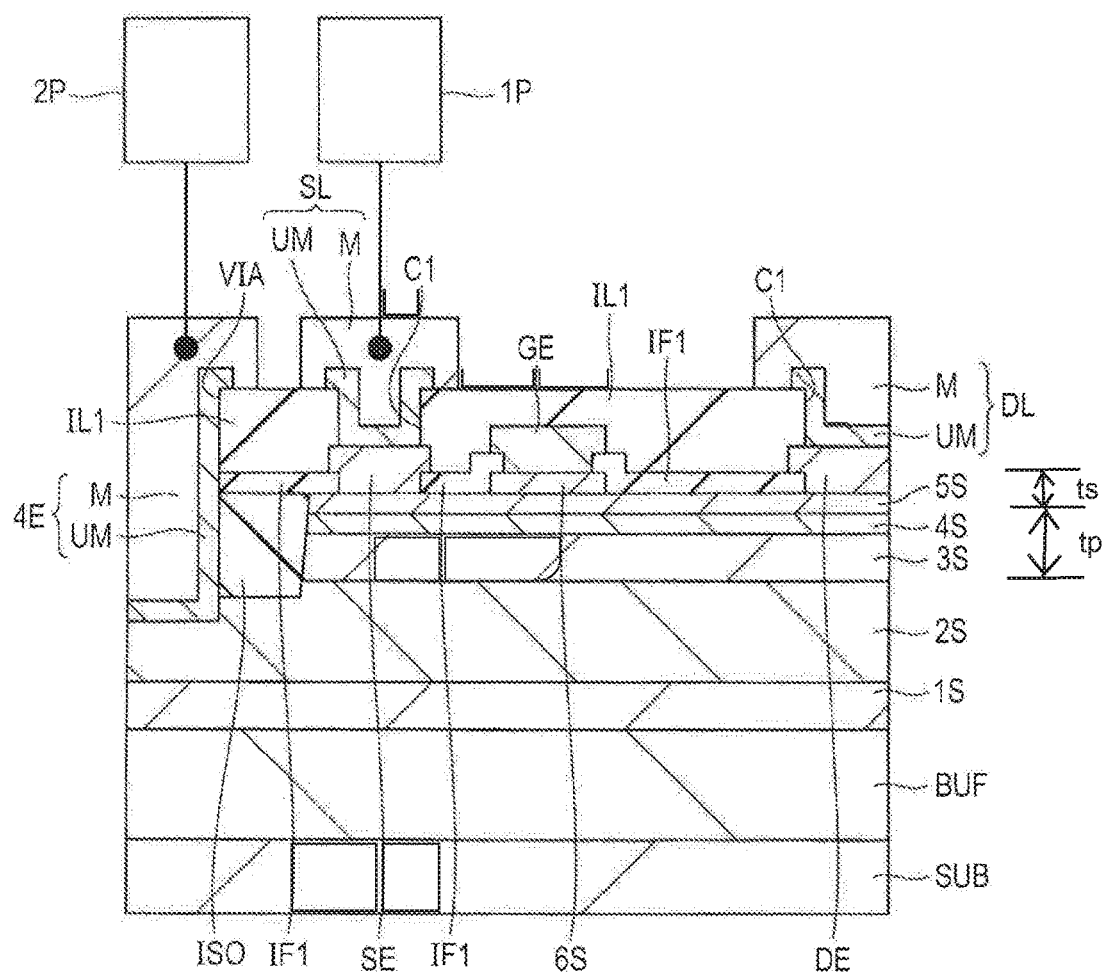
FIG. 26 is a sectional view illustrating a configuration of a semiconductor device of a third embodiment.

FIG. 26 is a sectional view illustrating a configuration of the semiconductor device of the third embodiment. The semiconductor device (semiconductor element) of the third embodiment is a transistor including a nitride semiconductor. The semiconductor device can be used as a power transistor of a high electron mobility transistor (HEMT) type.

In the semiconductor device of the third embodiment, as in the first embodiment, the undepicted nucleation layer, the high-resistance buffer layer BUF, the first nitride semiconductor layer (buffer layer) 1S, the second nitride semiconductor layer (voltage clamp Layer) 2S, the third nitride semiconductor layer (channel underlayer) 3S, the fourth nitride semiconductor layer (channel layer) 4S, and the fifth nitride semiconductor layer (barrier layer) 5S are provided in order on the substrate SUB.

The nucleation layer includes a nitride semiconductor layer. The high-resistance buffer layer BUF includes one or more nitride semiconductor layers doped with an impurity that forms a deep level with respect to the nitride semiconductor. For example, a superlattice structure including a plurality of nitride semiconductor layers can be used as the high-resistance buffer layer BUF.

The first nitride semiconductor layer 1S may be referred to as buffer layer. The second nitride semiconductor layer (voltage clamp layer) 2S contains a p-type impurity (for example, Mg). The third nitride semiconductor layer (channel underlayer) 3S has an electron affinity substantially equal to that of the second nitride semiconductor layer 2S (3S≈2S). The fourth nitride semiconductor layer (channel layer) 4S has an electron affinity substantially equal to or larger than that of the second nitride semiconductor layer 2S (4S≥2S). The fifth nitride semiconductor layer (barrier layer) 5S has an electron affinity smaller than that of the fourth nitride semiconductor layer 4S (5S<4S). An insulating film IF1 is provided on the fifth nitride semiconductor layer (barrier layer) 5S.

The respective materials described in the first embodiment can also be used for the substrate SUB, the high-resistance buffer layer BUF, the first to fifth nitride semiconductor layers 1S to 5S, and the insulating film IF1.

The semiconductor element of the third embodiment includes the gate electrode GE provided above the fifth nitride semiconductor layer (barrier layer) 5S with a sixth nitride semiconductor layer (mesa-type gate junction layer) 6S in between, and the source electrode SE and the drain electrode DE on the fifth nitride semiconductor layer (barrier layer) 5S on both sides of the gate electrode GE. This semiconductor element is provided in an active region partitioned by the element isolation region ISO.

The sixth nitride semiconductor layer (mesa-type gate junction layer) 6S has an electron affinity larger than that of the fifth nitride semiconductor layer (barrier layer) 5S (6S>5S). The sixth nitride semiconductor layer (gate junction layer) 6S is preferably in ohmic contact with the gate electrode GE.

Although two-dimensional electron gas (2DEG) is generated on a side close to the fourth nitride semiconductor layer (channel layer) 4S in the vicinity of the interface between the fourth nitride semiconductor layer (channel layer) 4S and the fifth nitride semiconductor layer (barrier layer) 5S, the two-dimensional electrons gas (2DEG) is not formed below the sixth nitride semiconductor layer (gate junction layer) 6S because the conduction band of the fourth nitride semiconductor layer (channel layer) 4S is raised by negative charges caused by acceptor ionization. In the semiconductor device of the third embodiment, therefore, an off state can be maintained while a positive voltage (threshold voltage) is not applied to the gate electrode GE, and an on state can be maintained while the positive voltage (threshold voltage) is applied to the gate electrode GE. For example, the threshold is around 1.5 V.

Operation of the semiconductor device (FIG. 26) of the third embodiment is now described. When a DC voltage is externally applied to the fourth electrode 4E, the second nitride semiconductor layer (voltage clamp layer) 2S has a voltage equal to that of the fourth electrode 4E, and thus serves as a back gate. Consequently, the threshold of the transistor can be controlled.

A distance from the bottom (p+n junction portion) of the gate electrode GE to the interface between the fourth nitride semiconductor layer (channel layer) 4S and the fifth nitride semiconductor layer (barrier layer) 5S is denoted by ts, and a distance from the top of the second nitride semiconductor layer (voltage clamp layer) 2S to the interface between the fourth nitride semiconductor layer (channel layer) 4S and the fifth nitride semiconductor layer (barrier layer) 5S is denoted by tp. The relative dielectric constant of the nitride semiconductor layer is denoted by εn, and the external DC voltage is denoted by Vsub, and thus variation δVt in the threshold (Vt) can be expressed by the equation (2).

$$\delta Vt = (\varepsilon n/tp)/(\varepsilon n/ts) \times V\text{sub} \qquad (2)$$

Figure 27:
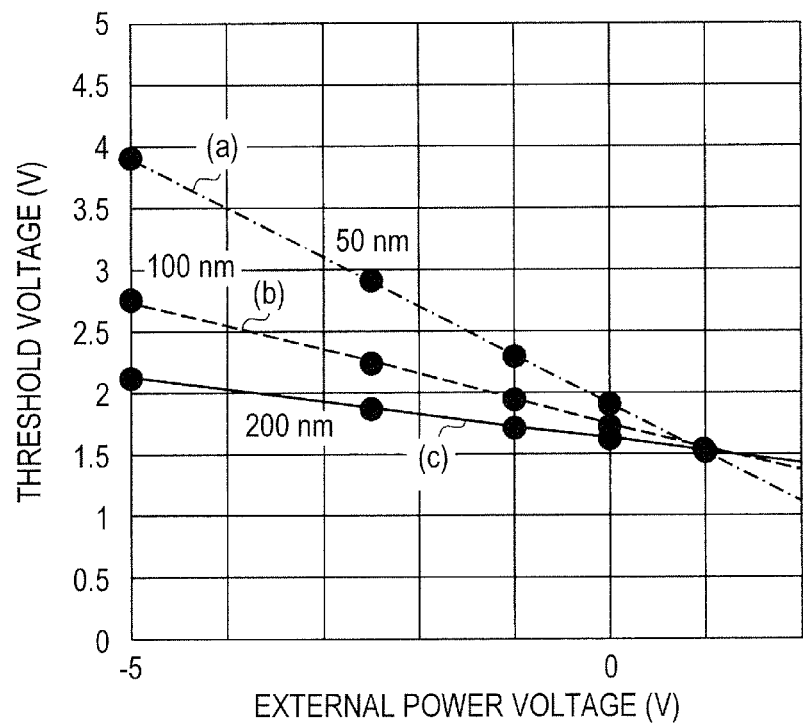
FIG. 27 is a graph illustrating a relationship between an external power voltage and a threshold voltage.

FIG. 27 is a graph showing a relationship between an external power voltage and a threshold voltage. The horizontal axis represents the external power voltage (V), and the vertical axis represents the threshold voltage (V). Specifically, FIG. 27 shows variations in the threshold voltage when a negative voltage (external power voltage) is applied from the external DC power supply as the voltage application unit 2P to the fourth electrode 4E in the semiconductor device (FIG. 26) of the third embodiment. Assuming the distance ts is 20 nm, a graph (a) shows the case of the distance tp of 50 nm, a graph (b) shows the case of the distance tp of 100 nm, and a graph (c) shows the case of the distance tp of 200 nm. The voltage of the source electrode SE is assumed to be the ground voltage (0 V).

FIG. 27 reveals that when the external power voltage is varied from +1 V to −5 V, the threshold voltage increases with a decrease in the external power voltage in any of the graphs (a) to (c).

For example, when the external power voltage is 0 V, the threshold is +1.9 V, +1.7 V, and +1.6 V for the distance tp of 50 nm, 100 nm, and 200 nm, respectively. In this way, although the threshold increases up to nearly +2.0 V with a decrease in the distance tp, the target threshold in the range of 2 to 3 V cannot be achieved.

The negative voltage is independently applied to the second nitride semiconductor layer (voltage clamp layer) 2S via the fourth electrode 4E as in the third embodiment, thereby the threshold can be increased above +2.0 V (FIG. 27). For example, even if the distance tp of 200 nm, the threshold can be adjusted to +2.1 V for the external power voltage of −5 V. When the external power voltage is −5 V for the distance tp of 100 nm, the threshold can be adjusted to +2.7 V. When the external power voltage is −2.5 V for the thickness of the distance tp of 50 nm, the threshold can be adjusted to +2.9 V. In this way, a target threshold of more than 2 V can be achieved.

In this way, the third embodiment also provides a junction-type MISFET including a nitride semiconductor, in which the second nitride semiconductor layer (voltage clamp layer) 2S and the fourth electrode 4E, which is electrically coupled to the second nitride semiconductor layer, are provided, and a voltage lower than the voltage (source voltage) applied to the source electrode SE is applied to the second nitride semiconductor layer (voltage clamp layer) 2S via the fourth electrode 4E, thereby the threshold control can be controlled. For example, the threshold of a normally-off FET can be increased.

Description of Manufacturing Method

A method of manufacturing the semiconductor device of the third embodiment is now described with reference to FIG. 26 while the configuration of the semiconductor device is further clarified. The semiconductor device of the third embodiment can be formed through steps similar to those of the first embodiment.

The undepicted nucleation layer, the high-resistance buffer layer BUF, the first nitride semiconductor layer (buffer layer) 1S, the second nitride semiconductor layer (voltage clamp Layer) 2S, the third nitride semiconductor layer (channel underlayer) 3S, the fourth nitride semiconductor layer (channel layer) 4S, and the fifth nitride semiconductor layer (barrier layer) 5S are formed in order on the substrate SUB (see FIG. 2).

Subsequently, a sixth nitride semiconductor layer (gate junction layer) 6S is formed on the fifth nitride semiconductor layer (barrier layer) 5S. For example, a gallium nitride layer (p-GaN layer) containing a p-type impurity is heteroepitaxially grown by a metal organic chemical vapor deposition process or the like. For example, magnesium (Mg) is used as the p-type impurity. Subsequently, the sixth nitride semiconductor layer (gate junction layer) 6S is patterned by a photolithography technique and an etching technique. Subsequently, the insulating film IF1 and the element isolation region ISO are formed as in the first embodiment. Subsequently, the insulating film IF1 on the sixth nitride semiconductor layer (gate junction layer) 6S is removed using a photolithography technique and an etching technique.

Subsequently, the gate electrode GE is formed on the sixth nitride semiconductor layer (gate junction layer) 6S. For example, a titanium nitride (TiN) film is deposited as a conductive film on the sixth nitride semiconductor layer (gate junction layer) 6S by a sputtering process or the like, and the TiN film is patterned to form the gate electrode GE.

Subsequently, as in the first embodiment, the insulating film IF1 located on either side of the gate electrode GE is removed, and the source electrode SE and the drain electrode DE are formed on the fifth nitride semiconductor layer (barrier layer) 5S on both sides of the gate electrode GE.

Subsequently, as in the first embodiment, the interlayer insulating film IL1 is formed on the insulating film IF1 including over the gate electrode GE, the source electrode SE, and the drain electrode DE, and a contact hole C1 is formed in the interlayer insulating film IL1. Subsequently, a via hole (through hole) VIA is formed.

Subsequently, as in the first embodiment, the fourth electrode 4E, the source line (source interconnection) SL, the drain line (drain interconnection) DL, and the gate line (gate interconnection) GL are formed.

Subsequently, an undepicted protective film is formed on the interlayer insulating film IL1 including over the fourth electrode 4E, the source line SL, the drain line DL, and the gate line GL. Subsequently, part of the protective film is removed to expose the pad region.

The semiconductor device of the third embodiment can be formed through the above-described steps. Such steps are merely shown as an example, and the semiconductor device of the third embodiment may be manufactured through other steps.

Fourth Embodiment

While the semiconductor device (MISFET) of each of the first to third embodiments can be applied to any circuit without limitation, the semiconductor device can be applied to a half bridge circuit, for example.

Figure 28:
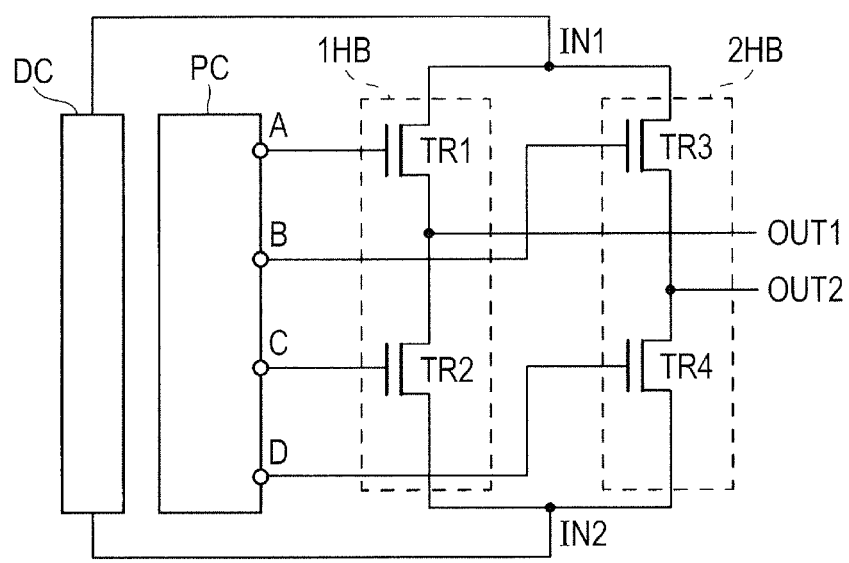
FIG. 28 illustrates a configuration of an inverter circuit having a half bridge circuit.

FIG. 28 illustrates a configuration of an inverter circuit having a half bridge circuit. This circuit includes a first half bridge circuit 1HB, a second half bridge circuit 2HB, and a pulse width modulation circuit PC, in which a DC signal is sent from the DC power source DC to the input terminals IN1 and IN2, and an AC signal is output from the output terminals OUT1 and OUT2.

The first half bridge circuit 1HB includes a high-side transistor TR1 and a low-side transistor TR2. The second half bridge circuit 2HB includes a high-side transistor TR3 and a low-side transistor TR4. The on/off control of the respective transistors TR1 to TR4 are performed by control signals A to D output from the pulse width modulation circuit PC.

For example, the semiconductor device (MISFET) of one of the above-described embodiments can be applied as each of the transistors TR1 to TR4.

For example, the source node of the high-side transistor TR1 is the output terminal OUT1, and a relatively low voltage with respect to the source node is applied to the fourth electrode, thereby threshold control can be performed.

For example, the source node of the high-side transistor TR3 is the output terminal OUT2, and a relatively low voltage with respect to the source node is applied to the fourth electrode, thereby threshold control can be performed.

For example, the source node of the low-side transistor TR2 is the input terminal IN2, and a relatively low voltage with respect to the source node is applied to the fourth electrode, thereby threshold control can be performed.

For example, the source node of the low-side transistor TR4 is the input terminal IN2, and a relatively low voltage with respect to the source node is applied to the fourth electrode, thereby threshold control can be performed.

Figure 29:
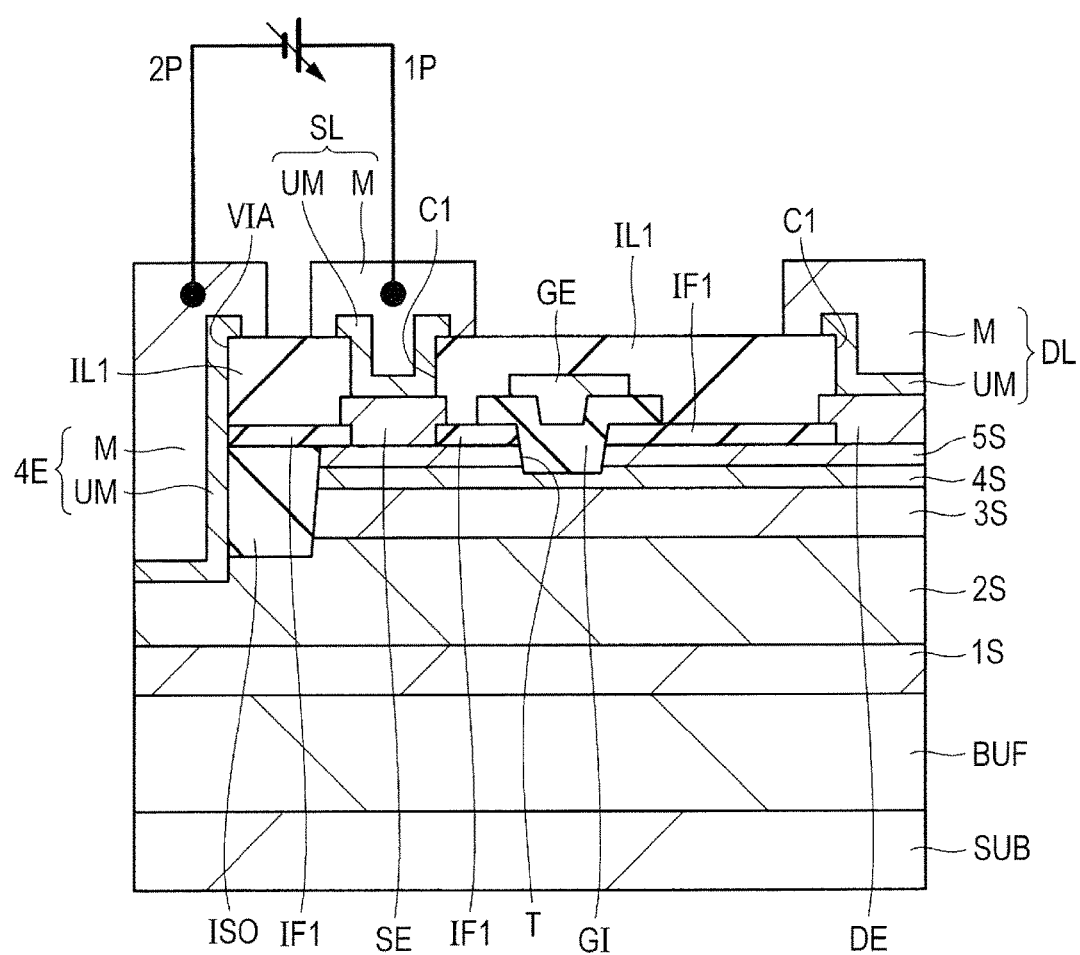
FIG. 29 is a sectional view illustrating a configuration of a semiconductor device of a fourth embodiment.

A voltage of the source node of each transistor or a voltage of the fourth electrode is not necessary to be a fixed voltage, and is set in accordance with operation of the applied circuit. At this time, for example, as shown in FIG. 29, a voltage, which is relatively low with respect to the voltage (source voltage) applied to the source electrode SE, is applied to the second nitride semiconductor layer (voltage clamp layer) 2S via the fourth electrode 4E, thereby threshold control can be performed. FIG. 29 is a sectional view illustrating a configuration of the semiconductor device of the fourth embodiment.

A voltage, which is relatively low with respect to the voltage (source voltage) applied to the source electrode SE, is applied to the second nitride semiconductor layer (voltage clamp layer) 2S via the fourth electrode 4E, thereby the threshold can be increased. When the threshold is intentionally decreased, a voltage, which is high relative to the voltage (source voltage) applied to the source electrode SE, should be applied (see FIGS. 16 and 27). In this way, a voltage, which is relatively different from the voltage applied to the source electrode, is applied to the fourth electrode 4E, thereby threshold control can be performed. In other words, when the voltage applied to the fourth electrode 4E is relatively different from the source voltage, such potentials may vary in conjunction with each other via the circuit.

Although the potentials may be applied in any order without limitation, for example, a predetermined voltage is preferably applied to the fourth electrode 4E before a high voltage is applied between the source and the drain. For example, a source potential (0 V) is applied to the source electrode, and then a negative potential is applied from the external power supply to the fourth electrode, and then a drain potential (for example, 600 V) is applied to the drain electrode, and then an adjusted threshold potential is applied to the gate electrode. In such a case, the adjusted threshold potential is higher than the threshold potential in case that the fourth electrode has a potential equal to the source potential.

The semiconductor device can be widely applied not only to the half bridge circuit but also to circuits, which each require a device performance of high withstand voltage, such as a power factor correction (PFC) circuit.

Fifth Embodiment

Although the stacked portion of the source electrode SE and the source line SL and the stacked portion of the drain electrode DE and the drain line DL are provided on the fifth nitride semiconductor layer (barrier layer) 5S in the first embodiment (FIG. 1), such portions may each be formed as a single layer film.

Figure 30:
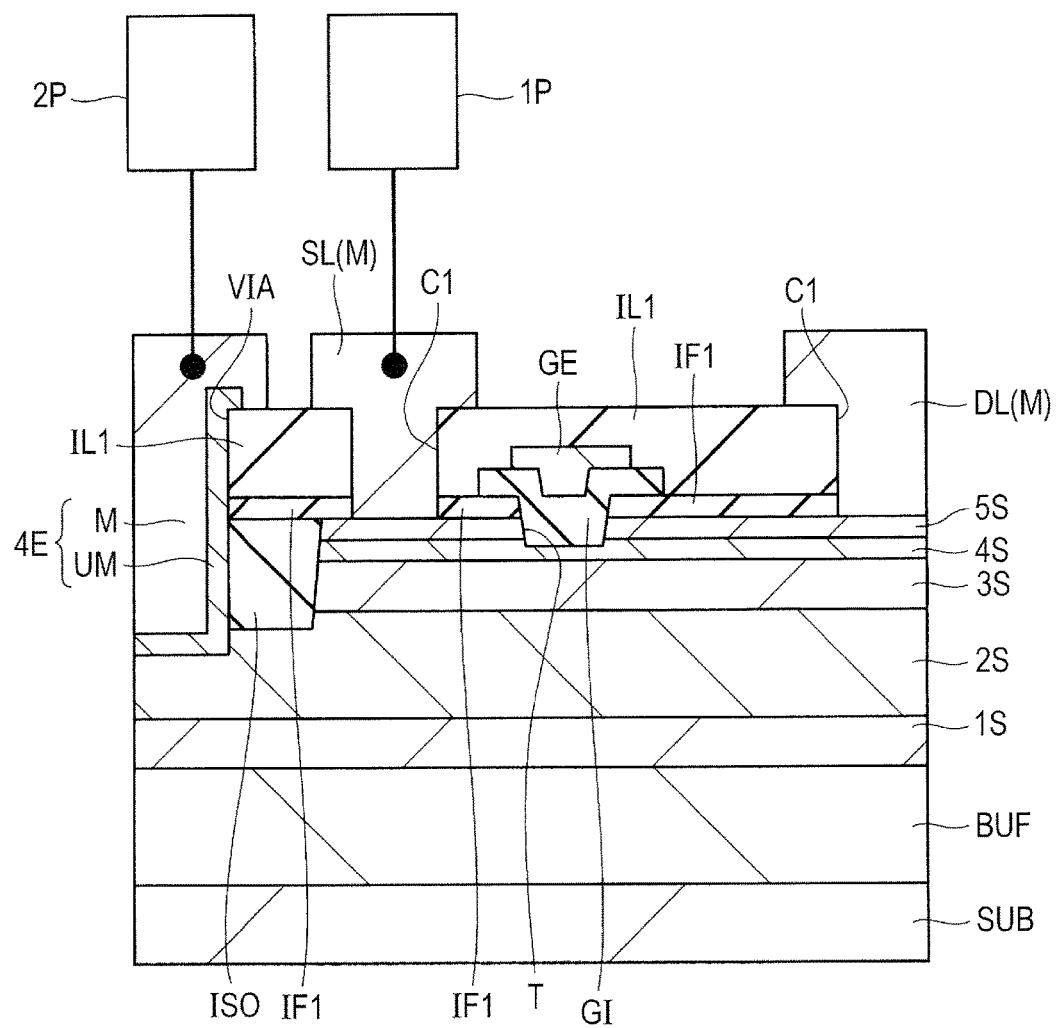
FIG. 30 is a sectional view illustrating a configuration of a semiconductor device of a fifth embodiment.

FIG. 30 is a sectional view illustrating a configuration of a semiconductor device of a fifth embodiment. As shown in FIG. 30, the semiconductor device of the fifth embodiment is designed such that the source electrode portion (source line portion) and the drain electrode portion (drain line portion) are each formed of a single layer film. Other portions are similar to those of the first embodiment (FIG. 1); hence, duplicated description is omitted.

The single layer film configuring the source electrode portion or the drain electrode portion includes a metal film M. For example, an AlCu (alloy of Al and Cu) film can be used as the metal film M. The metal film M is coupled to the fifth nitride semiconductor layer (barrier layer) 5S via the contact hole C1.

For example, the metal film M may have a planar shape equal to that of the source line SL or the drain line DL of the first embodiment.

A method of manufacturing the semiconductor device of the fifth embodiment is now described with reference to FIGS. 31 to 43 while the configuration of the semiconductor device is further clarified. FIGS. 31 to 43 include sectional views and plan views illustrating a manufacturing process of the semiconductor device of the fifth embodiment.

Figure 31:
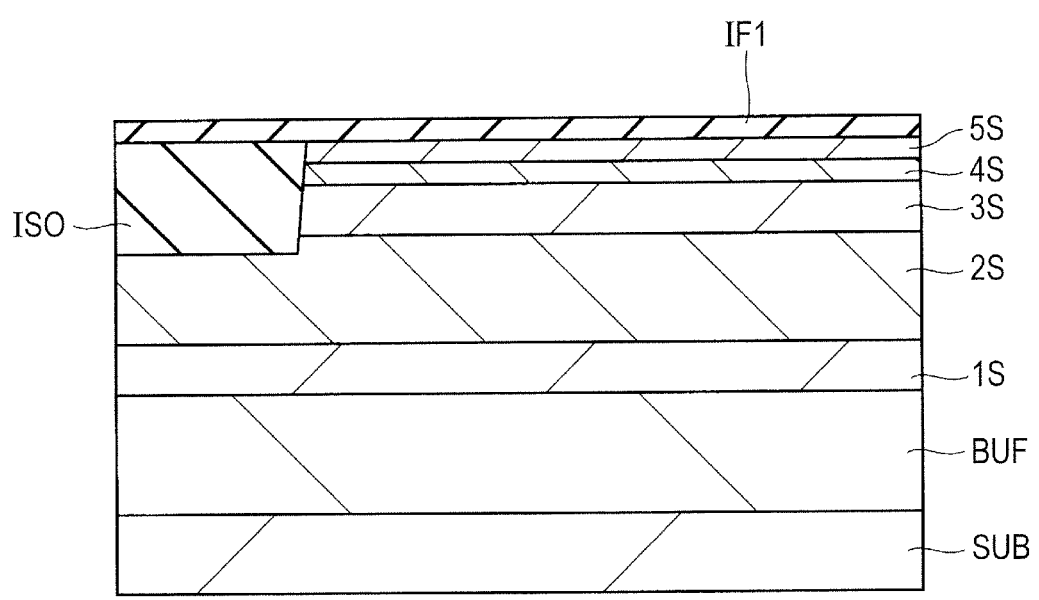
FIG. 31 is a sectional view illustrating a manufacturing process of a semiconductor device of the fifth embodiment.

As illustrated in FIG. 31, the undepicted nucleation layer, the high-resistance buffer layer BUF, the first nitride semiconductor layer (buffer layer) 1S, the second nitride semiconductor layer (voltage clamp layer) 2S, the third nitride semiconductor layer (channel underlayer) 3S, the fourth nitride semiconductor layer (channel layer) 4S, and the fifth nitride semiconductor layer (barrier layer) 5S are formed in order on the substrate SUB. Such layers are formed as in the first embodiment.

Figure 32:
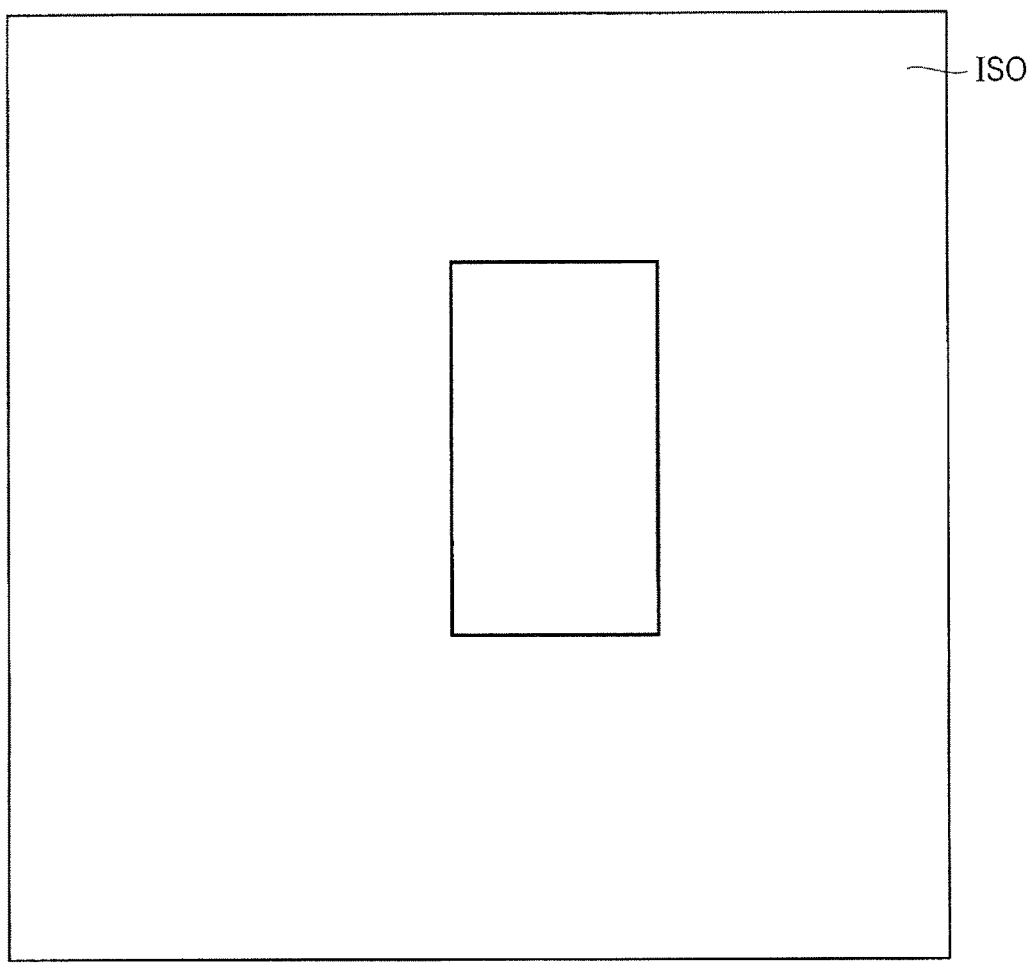
FIG. 32 is a plan view illustrating the manufacturing process of the semiconductor device of the fifth embodiment.

Subsequently, a silicon nitride film is deposited as the insulating film IF1 on the fifth nitride semiconductor layer (barrier layer) 5S, and the element isolation region ISO is formed around the active region (FIG. 32). The silicon nitride film and the element isolation region ISO can be formed as in the first embodiment.

Figure 33:
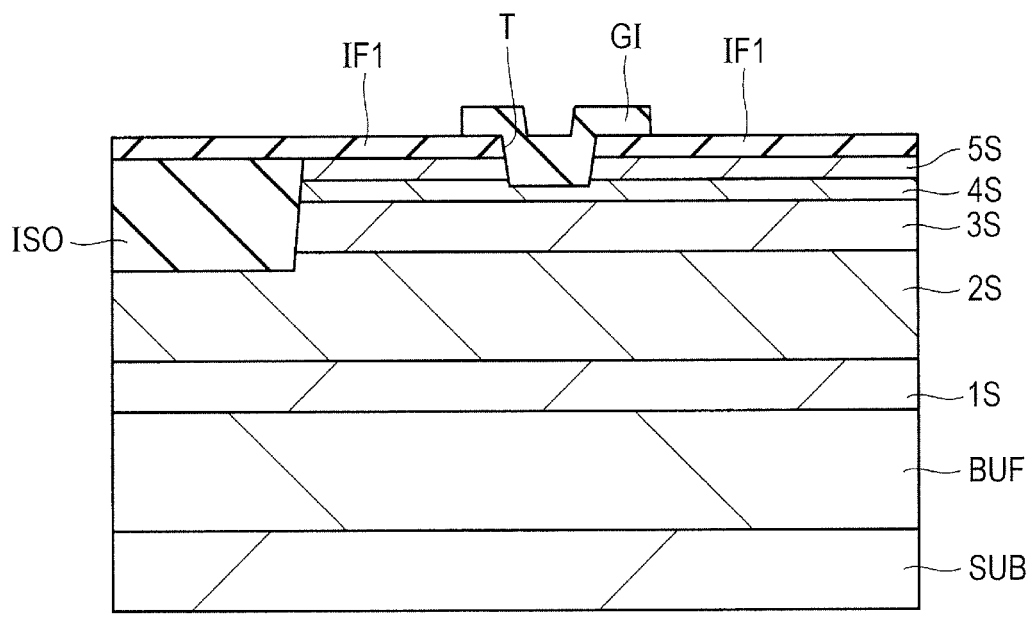
FIG. 33 is a sectional view illustrating the manufacturing process of the semiconductor device of the fifth embodiment.

Subsequently, as shown in FIG. 33, the trench T is formed, and the gate insulating film GI is formed thereon. The trench T and the gate insulating film GI can be formed as in the first embodiment.

Figure 34:
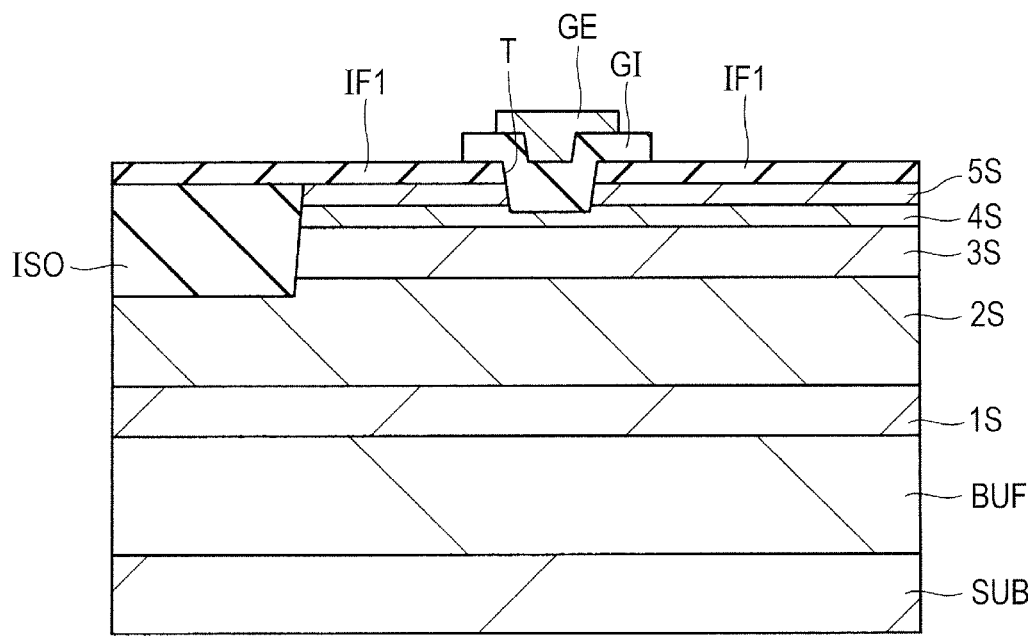
FIG. 34 is a sectional view illustrating the manufacturing process of the semiconductor device of the fifth embodiment.
Figure 35:
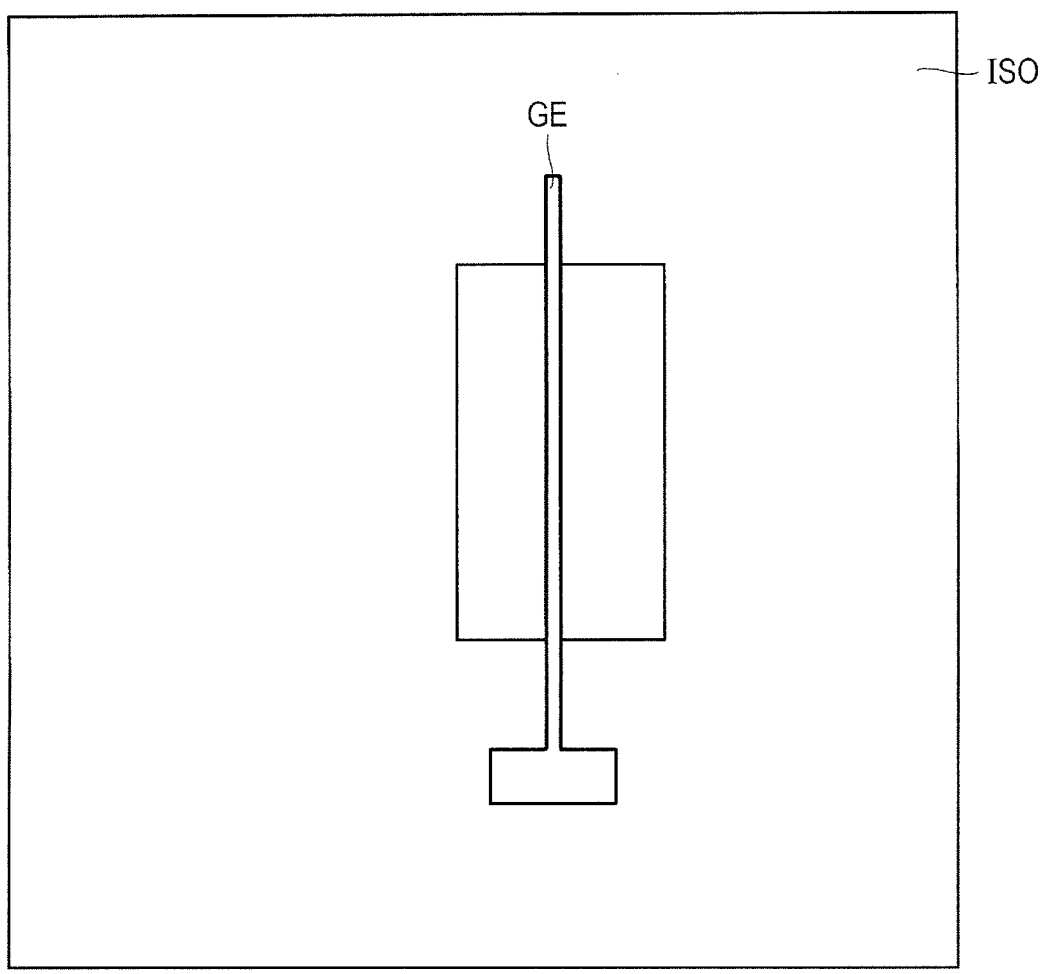
FIG. 35 is a plan view illustrating the manufacturing process of the semiconductor device of the fifth embodiment.

Subsequently, as shown in FIGS. 34 and 35, the gate electrode GE is formed on the gate insulating film GI. The gate electrode GE can be formed as in the first embodiment.

Figure 36:
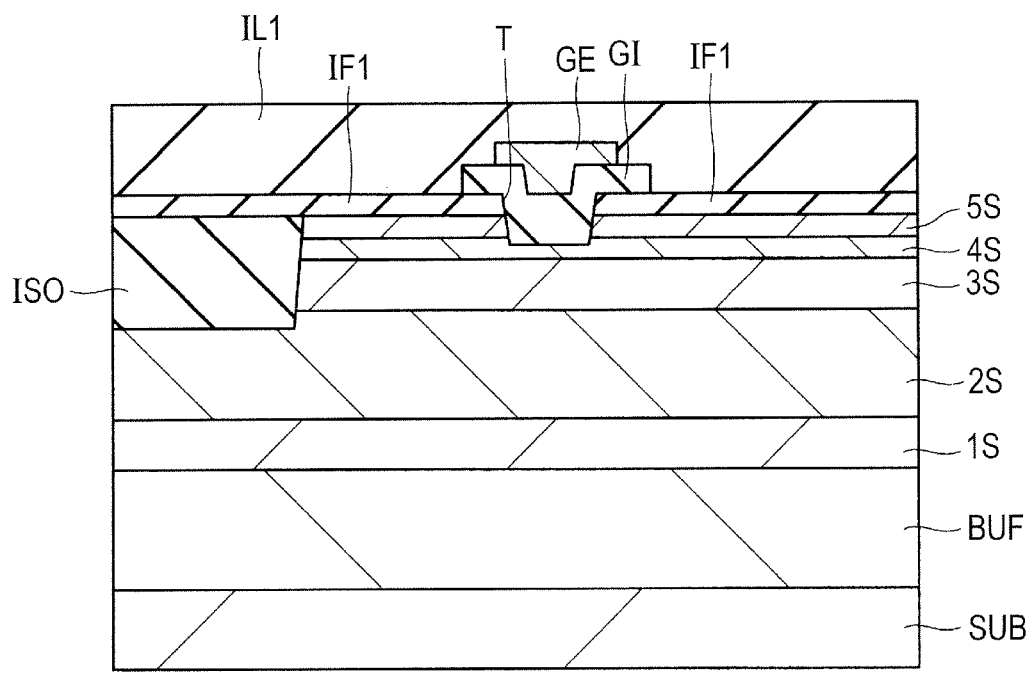
FIG. 36 is a sectional view illustrating the manufacturing process of the semiconductor device of the fifth embodiment.

Subsequently, as shown in FIG. 36, for example, a silicon oxide film is deposited as the interlayer insulating film IL1 over the gate electrode GE and the insulating film IF1 as in the first embodiment.

Figure 37:
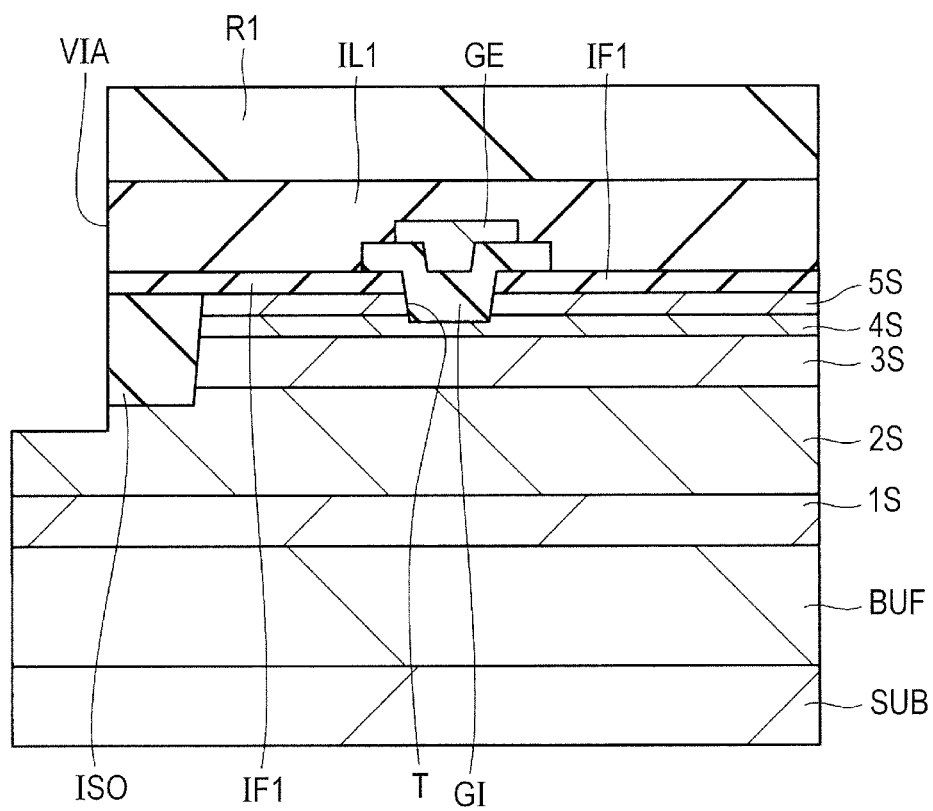
FIG. 37 is a sectional view illustrating the manufacturing process of the semiconductor device of the fifth embodiment.
Figure 38:
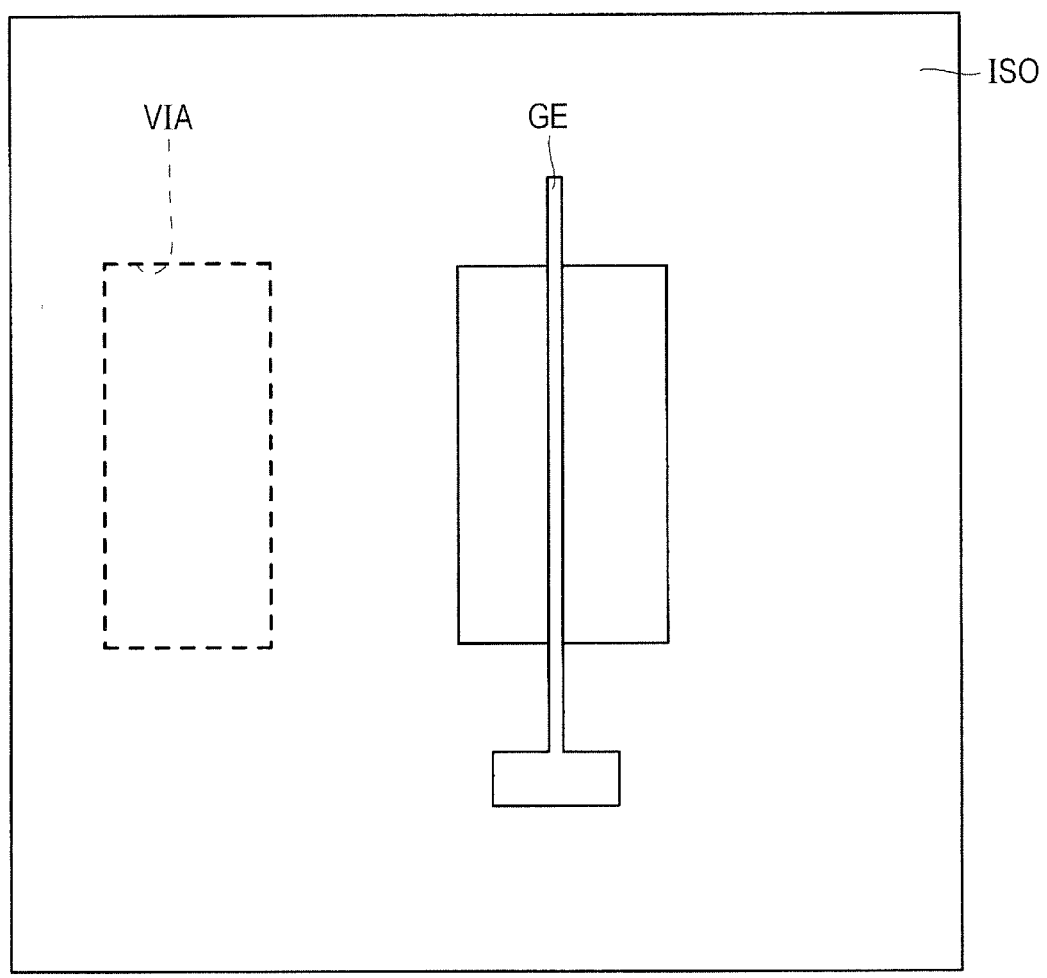
FIG. 38 is a plan view illustrating the manufacturing process of the semiconductor device of the fifth embodiment.

Subsequently, a via hole (through hole) VIA is formed using a photolithography technique and an etching technique (FIGS. 37 and 38). For example, a photoresist film R1 having an opening in a formation region of the via hole VIA is formed on the interlayer insulating film IL1. Subsequently, the interlayer insulating film IL1, the insulating film IF1, the element isolation region ISO, and part of the second nitride semiconductor layer (voltage clamp layer) 2S are etched with the photoresist film R1 as a mask, thereby the via hole VIA is formed. In other words, the via hole VIA is formed, which extends up to the middle of the second nitride semiconductor layer (voltage clamp layer) 2S while penetrating through the interlayer insulating film IL1, the insulating film IF1, and the element isolation region ISO. The interlayer insulating film IL1 and the insulating film IF1 are dry-etched using, for example, a fluorine-based gas, and the element isolation region ISO and the second nitride semiconductor layer (voltage clamp layer) 2S are dry-etched using a chlorine-based gas such as $BCl_3$, for example. Subsequently, the photoresist film R1 is removed. The second nitride semiconductor layer (voltage clamp layer) 2S is exposed from the bottom of the via hole VIA.

Figure 39:
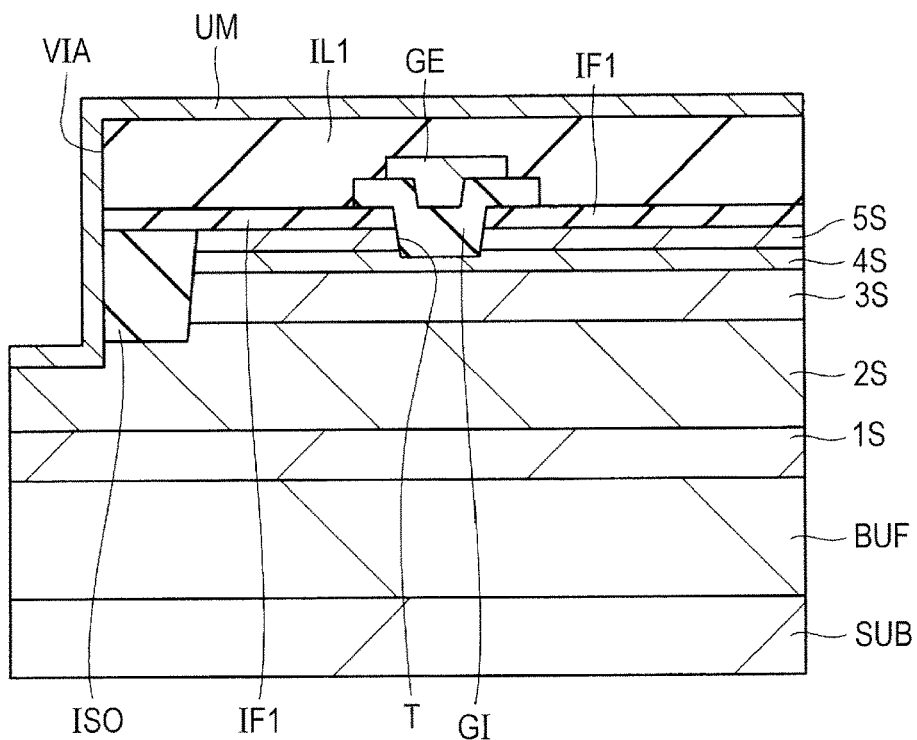
FIG. 39 is a sectional view illustrating the manufacturing process of the semiconductor device of the fifth embodiment.
Figure 40:
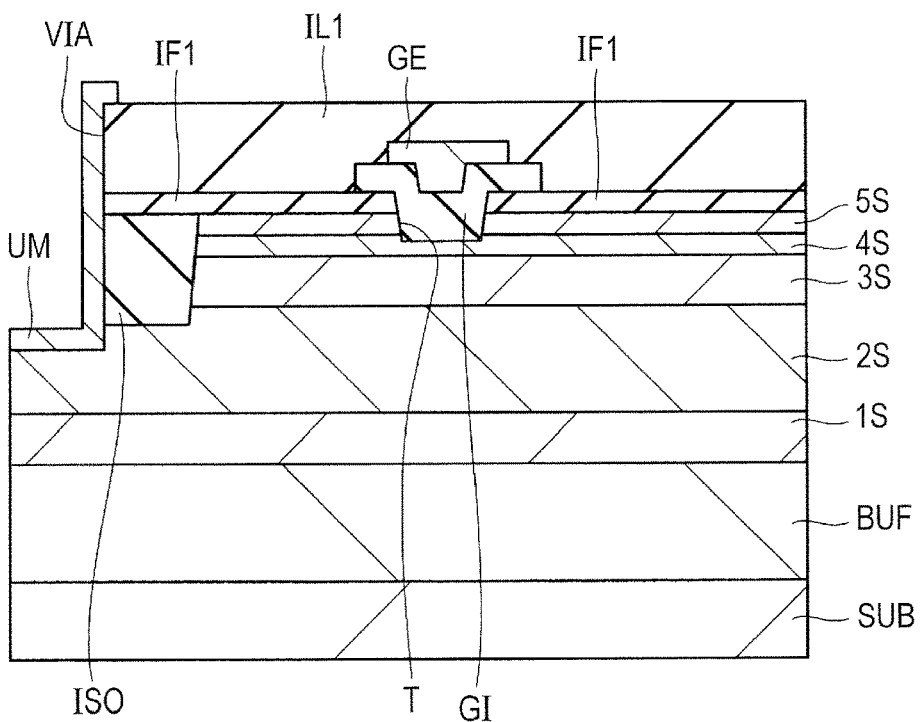
FIG. 40 is a sectional view illustrating the manufacturing process of the semiconductor device of the fifth embodiment.

Subsequently, as shown in FIG. 39, for example, a nickel (Ni) film is formed as the underlying metal film UM on the interlayer insulating film IL1 including within the via hole VIA by a sputtering process or the like. The Ni film has a thickness of, for example, about 50 nm. Subsequently, as shown in FIG. 40, the Ni film is left within the via hole VIA by a photolithography technique and an etching technique. Specifically, the Ni film is left so as to cover the inner wall of the via hole VIA.

Figure 41:
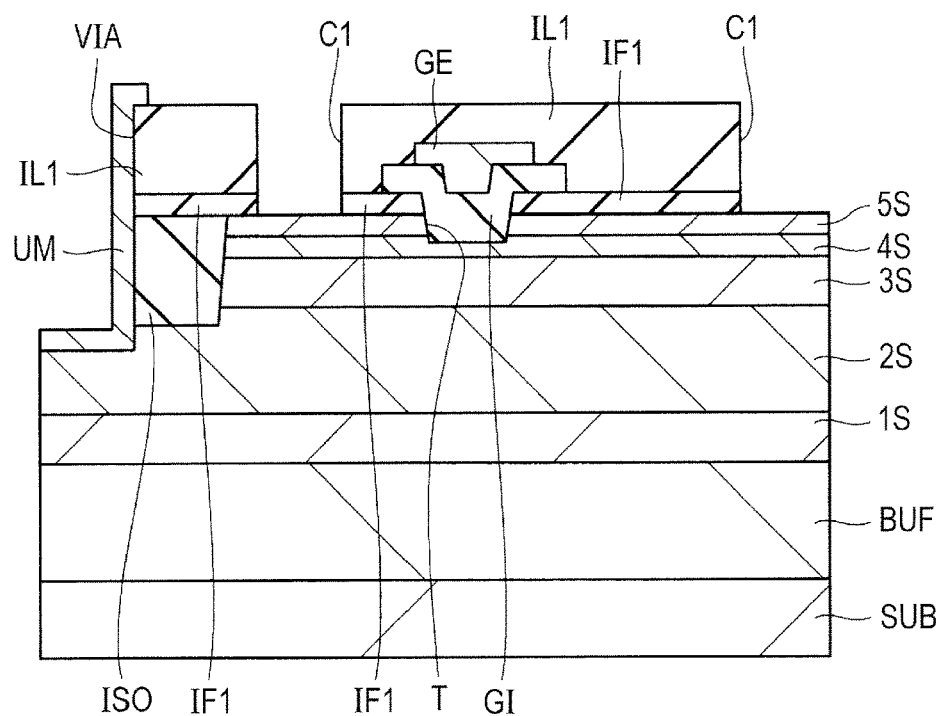
FIG. 41 is a sectional view illustrating the manufacturing process of the semiconductor device of the fifth embodiment.

Subsequently, as shown in FIG. 41, the contact hole C1 is formed in the interlayer insulating film IL1 and the insulating film IF1 by a photolithography technique and an etching technique. For example, dry etching is performed using a fluorine-based gas. The contact hole C1 is formed on the fifth nitride semiconductor layer (barrier layer) 5S on either side of the gate electrode GE.

Figure 42:
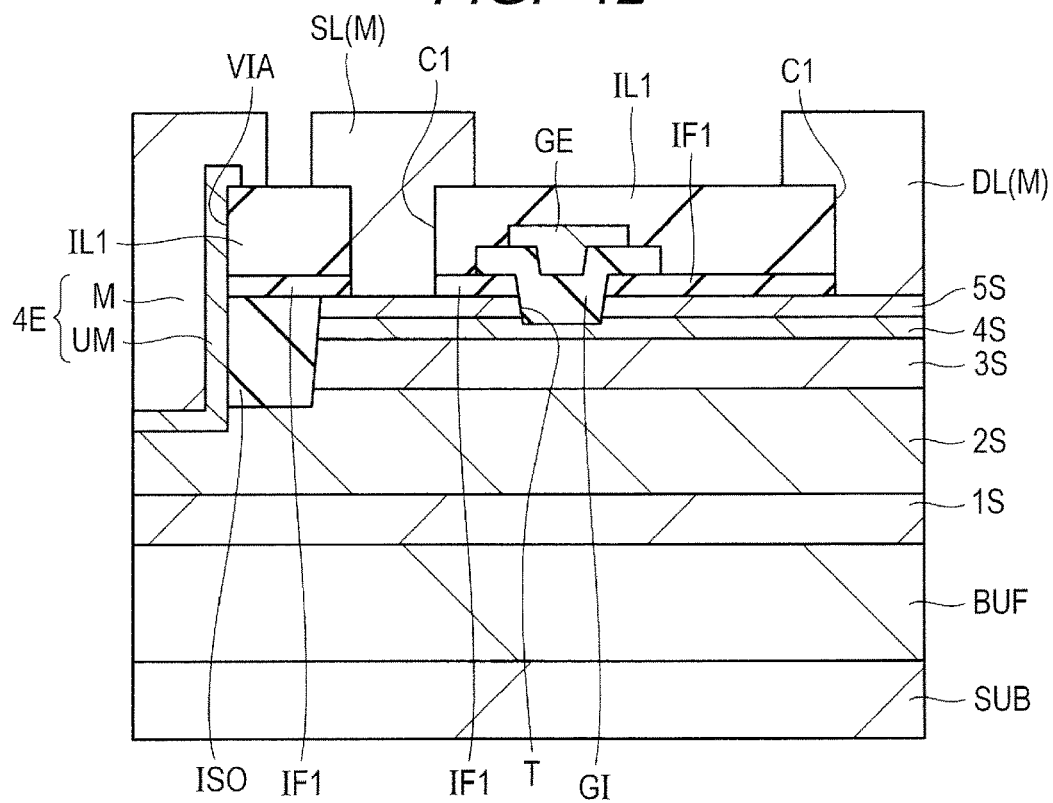
FIG. 42 is a sectional view illustrating the manufacturing process of the semiconductor device of the fifth embodiment.
Figure 43:
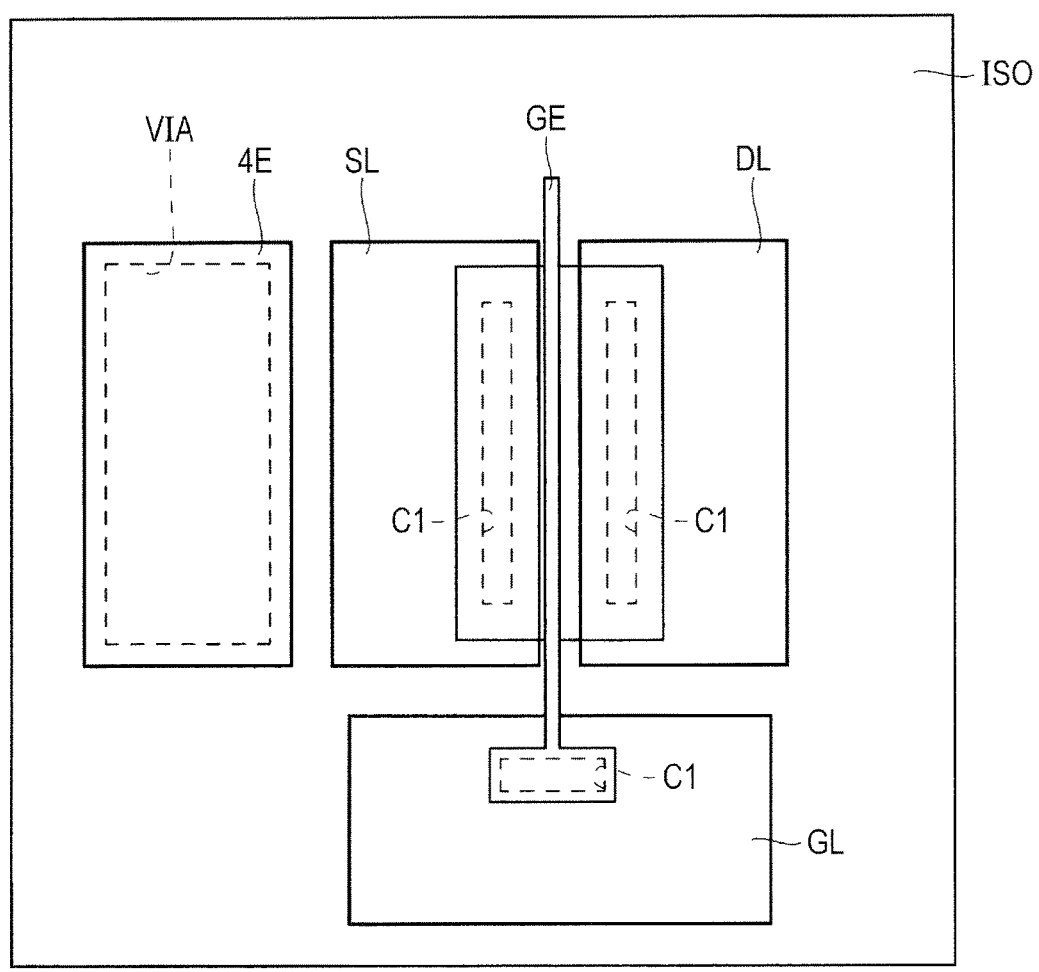
FIG. 43 is a plan view illustrating the manufacturing process of the semiconductor device of the fifth embodiment.

Subsequently, as shown in FIGS. 42 and 43, the via hole (through hole) VIA, the source line (source interconnection) SL, the drain line (drain interconnection) DL, and the gate line (gate interconnection) GL are formed. For example, an AlCu (alloy of Al and Cu) film is formed as the metal film M within the via hole VIA (on the underlying metal film UM) and over the contact hole C1 and the interlayer insulating film IL1 by a sputtering process or the like. The AlCu film has a thickness of about 1000 nm, for example. Subsequently, the AlCu film is left within each of the via hole VIA and the contact hole C1 and in the periphery thereof by a photolithography technique and an etching technique. Consequently, it is possible to form the fourth electrode 4E including a film stack of the base metal film UM and the metal film M, and form the source line SL, the drain line DL, and the gate line GL, each layer including a single-layer film of the metal film M.

Subsequently, an undepicted protective film is formed on the interlayer insulating film IL1 including over the fourth electrode 4E, the source line SL, the drain line DL, and the gate line GL. For example, a silicon oxynitride (SiON) film is deposited as a protective film on the interlayer insulating film IL1 by a CVD process or the like. Subsequently, part of the protective film is removed by a photolithography technique and an etching technique. Specifically, an opening of the protective film is provided on each of the fourth electrode 4E, the source line SL, the drain line DL, and the gate line GL. Such an opening serves as a pad region (see the second embodiment). A voltage (signal) can be applied via the opening to each of the fourth electrode 4E, the source line SL, the drain line DL, and the gate line GL. For example, the fourth electrode 4E is coupled to an external power supply, and the source pad is grounded.

The semiconductor device of the fifth embodiment can be formed through the above-described steps. Such steps are merely shown as an example, and the semiconductor device of the fifth embodiment may be manufactured through other steps.

In this way, the fifth embodiment also provides the effects similar to those of the first embodiment. For example, a negative voltage is independently applied to the second nitride semiconductor layer (voltage clamp layer) 2S via the fourth electrode 4E, thereby the threshold can be increased.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

Figure 44:
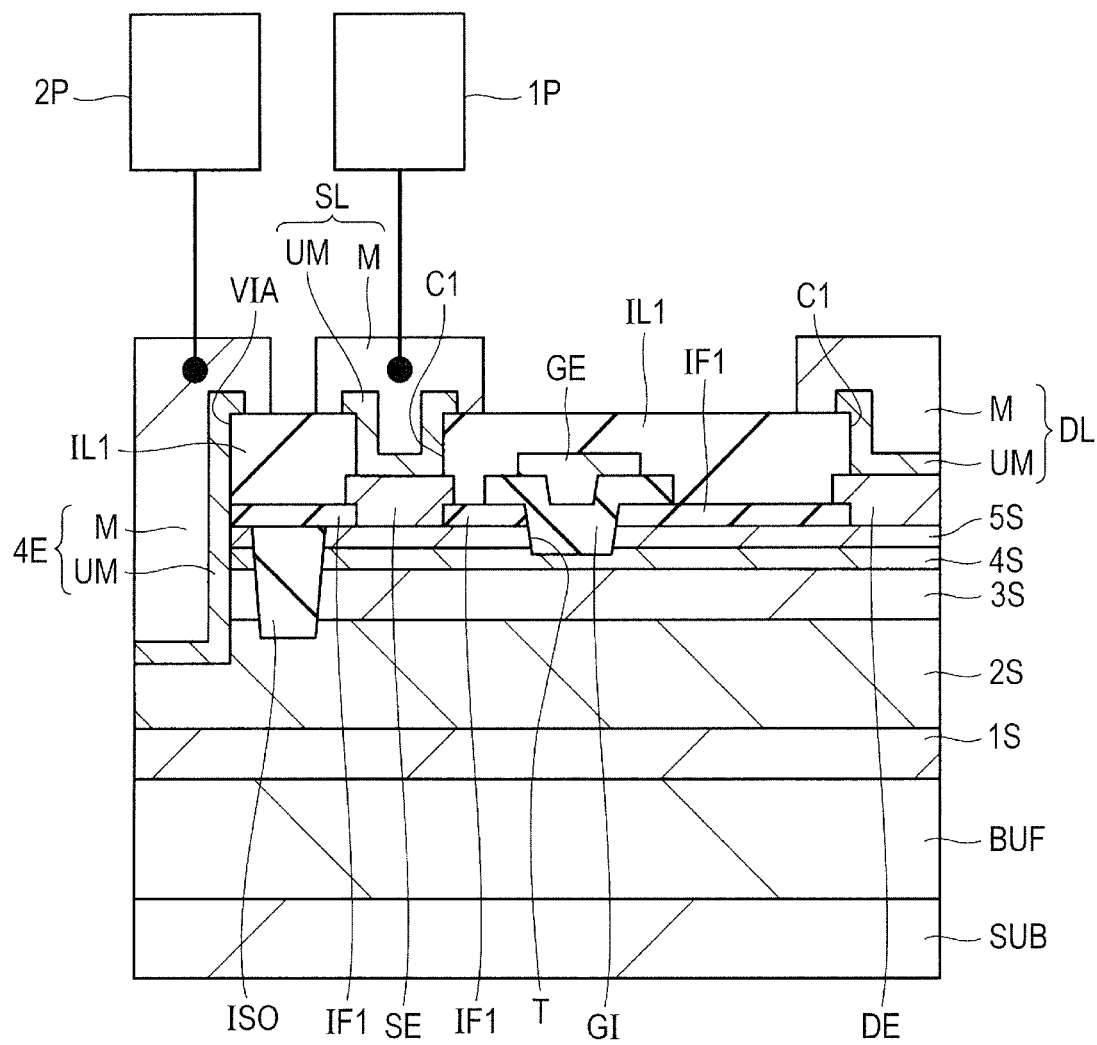
FIG. 44 is a sectional view illustrating another configuration of the semiconductor device of the fifth embodiment.

For example, although the fourth electrode 4E is formed in the element isolation region ISO in the first to fourth embodiments, the fourth electrode 4E may be formed in the active region as long as the fourth electrode 4E is electrically isolated from the source electrode SE. FIG. 44 is a sectional view illustrating another configuration of the semiconductor device of the fifth embodiment. In FIG. 44, the element isolation region ISO is provided between the fourth electrode 4E and the source electrode SE. In this case, the fourth electrode 4E is provided in the via hole VIA that extends up to the second nitride semiconductor layer (voltage clamp layer) 2S under the third nitride semiconductor layer 3S while penetrating through the fifth nitride semiconductor layer (barrier layer) 5S, the fourth nitride semiconductor layer (channel layer) 4S, and the third nitride semiconductor layer (channel underlayer) 3S. In such a case, for example, the element isolation region ISO may be provided within a substantially rectangular chip area along the outer periphery of the chip area, and through holes may be provided outside the element isolation region ISO so as to extend along the outer periphery of the chip area. In such a case, the shortest distance between the end of the chip area and the end of the via hole VIA is also desirably 0.01 to 0.2 mm. It will be appreciated that the fourth electrode 4E may also be provided in the active region in the case of the junction-type semiconductor device of the third embodiment.

[Supplementary Note 1]

A semiconductor device, including:

a first nitride semiconductor layer formed above a substrate;

a second nitride semiconductor layer formed over the first nitride semiconductor layer;

a third nitride semiconductor layer formed over the second nitride semiconductor layer;

a fourth nitride semiconductor layer formed over the third nitride semiconductor layer;

a gate electrode disposed above the fourth nitride semiconductor layer with a fifth nitride semiconductor layer in between;

a first electrode and a second electrode formed above the fourth nitride semiconductor layer on both sides of the gate electrode; and a coupling electrode electrically coupled to the first nitride semiconductor layer, where electron affinity of the second nitride semiconductor layer is equal to or larger than electron affinity of the first nitride semiconductor layer, where electron affinity of the third nitride semiconductor layer is equal to or larger than the electron affinity of the first nitride semiconductor layer, where electron affinity of the fourth nitride semiconductor layer is smaller than the electron affinity of the first nitride semiconductor layer, where electron affinity of the fifth nitride semiconductor layer is larger than the electron affinity of the fourth nitride semiconductor layer, where the coupling electrode is electrically isolated from the first electrode, and where a voltage applied to the coupling electrode is different from a voltage applied to the first electrode.

[Supplementary Note 2]

A semiconductor device, including:

a first nitride semiconductor layer formed above a substrate;

a second nitride semiconductor layer formed over the first nitride semiconductor layer;

a third nitride semiconductor layer formed over the second nitride semiconductor layer;

a fourth nitride semiconductor layer formed over the third nitride semiconductor layer;

a trench that extends up to the middle of the third nitride semiconductor layer while penetrating through the fourth nitride semiconductor layer;

a gate electrode disposed in the trench with a gate insulating film in between;

a first electrode and a second electrode formed above the fourth nitride semiconductor layer on both sides of the gate electrode; and a coupling electrode electrically coupled to the first nitride semiconductor layer, where electron affinity of the second nitride semiconductor layer is equal to or larger than electron affinity of the first nitride semiconductor layer, where electron affinity of the third nitride semiconductor layer is equal to or larger than the electron affinity of the first nitride semiconductor layer, where electron affinity of the fourth nitride semiconductor layer is smaller than the electron affinity of the first nitride semiconductor layer, and where a voltage applied to the coupling electrode is relatively different from a voltage applied to the first electrode.

What is claimed is:

1. A semiconductor device, comprising:

a first nitride semiconductor layer formed above a substrate;

a second nitride semiconductor layer formed over the first nitride semiconductor layer;
a third nitride semiconductor layer formed over the second nitride semiconductor layer;
a fourth nitride semiconductor layer formed over the third nitride semiconductor layer;
a trench that extends up to the middle of the third nitride semiconductor layer while penetrating through the fourth nitride semiconductor layer;
a gate electrode disposed in the trench with a gate insulating film in between;
a first electrode and a second electrode formed above the fourth nitride semiconductor layer on both sides of the gate electrode; and
a coupling electrode electrically coupled to the first nitride semiconductor layer,
wherein electron affinity of the second nitride semiconductor layer is equal to or larger than electron affinity of the first nitride semiconductor layer,
wherein electron affinity of the third nitride semiconductor layer is equal to or larger than the electron affinity of the first nitride semiconductor layer,
wherein electron affinity of the fourth nitride semiconductor layer is smaller than the electron affinity of the first nitride semiconductor layer,
wherein the coupling electrode is electrically isolated from the first electrode, and
wherein a voltage applied to the coupling electrode is different from a voltage applied to the first electrode.

2. The semiconductor device according to claim 1, wherein the coupling electrode is coupled to an external power supply.

3. The semiconductor device according to claim 2, wherein a voltage applied to the first electrode is a ground voltage.

4. The semiconductor device according to claim 3, wherein a voltage applied to the coupling electrode is lower than the voltage applied to the first electrode.

5. The semiconductor device according to claim 1, wherein the first nitride semiconductor layer contains a p-type impurity.

6. The semiconductor device according to claim 1, wherein the substrate includes a material selected from the group consisting of Si, SiC, sapphire, and GaN.

7. The semiconductor device according to claim 1, further comprising a buffer layer including a nitride semiconductor between the substrate and the first nitride semiconductor layer.

8. The semiconductor device according to claim 7, further comprising a nucleation layer including a nitride semiconductor between the substrate and the buffer layer.

9. The semiconductor device according to claim 1, wherein the coupling electrode is electrically isolated from the first electrode by an element isolation region.

10. The semiconductor device according to claim 9, wherein the coupling electrode is disposed within a through hole that extends up to the first nitride semiconductor layer while penetrating through the element isolation region.

11. The semiconductor device according to claim 9, wherein the coupling electrode is disposed within a through hole that extends up to the first nitride semiconductor layer while penetrating through the second nitride semiconductor layer, the third nitride semiconductor layer, and the fourth nitride semiconductor layer.

12. The semiconductor device according to claim 10, wherein the through hole is provided within a substantially rectangular chip area along an outer periphery of the chip area.

13. The semiconductor device according to claim 11,
wherein the element isolation region is provided within a substantially rectangular chip area along an outer periphery of the chip area, and
wherein the through hole is provided within the substantially rectangular chip area along the outer periphery of the chip area outside of the element isolation region.

14. The semiconductor device according to claim 12, wherein a distance between the through hole and an end of the chip area is 0.2 mm or less.

15. The semiconductor device according to claim 13, wherein a distance between the through hole and an end of the chip area is 0.2 mm or less.

16. A method of manufacturing a semiconductor device, comprising the steps of:
forming a first nitride semiconductor layer above a substrate;
forming a second nitride semiconductor layer over the first nitride semiconductor layer;
forming a third nitride semiconductor layer over the second nitride semiconductor layer;
forming a fourth nitride semiconductor layer over the third nitride semiconductor layer;
forming a trench that extends up to the middle of the third nitride semiconductor layer while penetrating through the fourth nitride semiconductor layer;
forming a gate electrode in the trench with a gate insulating film in between;
forming a first electrode and a second electrode above the fourth nitride semiconductor layer on both sides of the gate electrode; and
forming a through hole that extends up to the first nitride semiconductor layer, and forming a coupling electrode including a conductive film within the through hole,
wherein electron affinity of the second nitride semiconductor layer is equal to or larger than electron affinity of the first nitride semiconductor layer,
wherein electron affinity of the third nitride semiconductor layer is equal to or larger than the electron affinity of the first nitride semiconductor layer,
wherein electron affinity of the fourth nitride semiconductor layer is smaller than the electron affinity of the first nitride semiconductor layer,
wherein the coupling electrode is formed in a region that is electrically isolated from the first electrode, and
wherein the coupling electrode is electrically coupled to a voltage different from a voltage applied to the first electrode.

17. The method according to claim 16, wherein the coupling electrode is coupled to an external power supply that applies the voltage different from the voltage applied to the first electrode.

18. The method according to claim 17, wherein the first electrode is electrically coupled to a ground voltage.

19. The method according to claim 17, wherein the coupling electrode is coupled to the external power supply that applies a voltage lower than the voltage applied to the first electrode.

20. The method according to claim 16, wherein the first nitride semiconductor layer contains a p-type impurity.

* * * * *